US011990441B2

(12) United States Patent
Kim

(10) Patent No.: US 11,990,441 B2
(45) Date of Patent: May 21, 2024

(54) SEMICONDUCTOR PACKAGE

(71) Applicant: Samsung Electronics Co., Ltd., Suwon-si (KR)

(72) Inventor: Namhoon Kim, Gunpo-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 240 days.

(21) Appl. No.: 17/350,708

(22) Filed: Jun. 17, 2021

(65) Prior Publication Data

US 2022/0165696 A1 May 26, 2022

(30) Foreign Application Priority Data

Nov. 20, 2020 (KR) ........................ 10-2020-0157134

(51) Int. Cl.
*H01L 23/00* (2006.01)
*H01L 23/48* (2006.01)
*H01L 25/065* (2023.01)

(52) U.S. Cl.
CPC ............ *H01L 24/16* (2013.01); *H01L 23/481* (2013.01); *H01L 24/04* (2013.01); *H01L 24/17* (2013.01); *H01L 24/32* (2013.01); *H01L 24/33* (2013.01); *H01L 24/73* (2013.01); *H01L 25/0652* (2013.01); *H01L 25/0657* (2013.01); H01L 2224/02372 (2013.01); H01L 2224/0401 (2013.01); H01L 2224/16146 (2013.01); H01L 2224/16227 (2013.01); H01L 2224/1703 (2013.01); H01L 2224/17132 (2013.01); H01L 2224/17181 (2013.01); H01L 2224/17183 (2013.01); H01L 2224/32225 (2013.01); H01L 2224/33181 (2013.01); H01L 2224/33183 (2013.01); H01L 2224/73204 (2013.01); H01L 2225/06513 (2013.01); H01L 2225/06517 (2013.01)

(58) Field of Classification Search
CPC ........ H01L 24/16; H01L 23/481; H01L 24/04
See application file for complete search history.

(56) References Cited

U.S. PATENT DOCUMENTS

| 8,873,245 | B2 | 10/2014 | Kim et al. | |
| 9,601,461 | B2 | 3/2017 | Ho et al. | |
| 10,026,671 | B2 | 7/2018 | Yu et al. | |
| 10,636,769 | B2 | 4/2020 | Teh et al. | |
| 10,748,872 | B2 | 8/2020 | Kinsley | |
| 2018/0211929 | A1* | 7/2018 | Bae | H01L 21/6835 |
| 2019/0067245 | A1* | 2/2019 | Kinsley | H01L 23/49503 |

FOREIGN PATENT DOCUMENTS

| KR | 101099578 B1 | 12/2011 | |
| KR | 1020160017412 A | 2/2016 | |
| WO | WO-2019132968 A1 * | 7/2019 | ............. H01L 23/13 |

* cited by examiner

*Primary Examiner* — Errol V Fernandes
(74) *Attorney, Agent, or Firm* — Muir Patent Law, PLLC

(57) ABSTRACT

A semiconductor package comprising a package substrate that has a recessed portion on a top surface thereof, a lower semiconductor chip in the recessed portion of the package substrate, an upper semiconductor chip on the lower semiconductor chip and the package substrate and having a width greater than that of the lower semiconductor chip, a plurality of first bumps directly between the package substrate and the upper semiconductor chip, and a plurality of second bumps directly between the lower semiconductor chip and the upper semiconductor chip. A pitch of the second bumps is less than that of the first bumps.

18 Claims, 15 Drawing Sheets

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0157134 filed on Nov. 20, 2020 in the Korean Intellectual Property Office, the disclosure of which is hereby incorporated by reference in its entirety.

BACKGROUND

Examples of the present inventive concepts relate to a semiconductor package, and more particularly, to a semiconductor package including stacked semiconductor chips.

There have been suggested semiconductor chip stacking methods to increase integration and operating speeds of semiconductor devices. For example, a multi-chip package in which a plurality of semiconductor chips are mounted in a single semiconductor package or in a system-in package which includes stacked different chips that are operated as a single system has been proposed. A reduction in size of electronic products often includes a decrease in thickness of semiconductor packages.

SUMMARY

Some example embodiments of the present inventive concepts provide a compact-sized semiconductor package.

According to some example embodiments of the present inventive concepts, a semiconductor package may comprise: a package substrate that extends in a first direction and a second direction perpendicular to the first direction and that includes a recessed portion on a top surface of the package substrate; a lower semiconductor chip in the recessed portion of the package substrate; an upper semiconductor chip on the lower semiconductor chip and the package substrate, the upper semiconductor chip having a width greater than a width of the lower semiconductor chip, in the first direction; a plurality of first bumps directly between the package substrate and the upper semiconductor chip; and a plurality of second bumps directly between the lower semiconductor chip and the upper semiconductor chip. A pitch of the second bumps may be less than a pitch of the first bumps, in the first direction.

According to some example embodiments of the present inventive concepts, a semiconductor package may comprise: a package substrate that extends in a first direction and a second direction perpendicular to the first direction and that includes a recessed portion on a top surface of the package substrate; a lower semiconductor chip in the recessed portion of the package substrate; an upper semiconductor chip on the lower semiconductor chip and the package substrate; a plurality of first bumps directly between the package substrate and the upper semiconductor chip, the first bumps including first solder parts and first pillar patterns; and a plurality of second bumps directly between the lower semiconductor chip and the upper semiconductor chip, the second bumps including second solder parts and second pillar patterns. A height of the second pillar patterns may be substantially the same as a height of the first pillar patterns in a third direction perpendicular to the first direction and the second direction. A height of the second solder parts may be less than a height of the first solder parts, in the third direction.

According to some example embodiments of the present inventive concepts, a semiconductor package may comprise: a package substrate that extends in a first direction and a second direction perpendicular to the first direction and that includes a recessed portion on a top surface of the package substrate; a solder terminal on a bottom surface of the package substrate; a lower semiconductor chip in the recessed portion of the package substrate, the lower semiconductor chip including a plurality of through structures in the lower semiconductor chip; an upper semiconductor chip on the lower semiconductor chip and the package substrate, the upper semiconductor chip having a width greater than a width of the lower semiconductor chip, in the first direction; a plurality of first bumps directly between the package substrate and the upper semiconductor chip; a plurality of second bumps directly between the lower semiconductor chip and the upper semiconductor chip; a plurality of lower bumps between the lower semiconductor chip and a bottom surface of the recessed portion in the package substrate; and an under-fill layer in a first gap between the package substrate and the lower semiconductor chip and in a second gap between the package substrate and the upper semiconductor chip, the under-fill layer covering the lower bumps and the first bumps. The first bumps may include first solder parts and first pillar patterns. The second bumps may include second solder parts and second pillar patterns. A pitch of the second pillar patterns may be less than a pitch of the first pillar patterns in the first direction. A width of the second pillar pattern may be less than a width of each of the first pillar patterns in the first direction.

DETAILED DESCRIPTION OF EMBODIMENTS

Figure 1A:
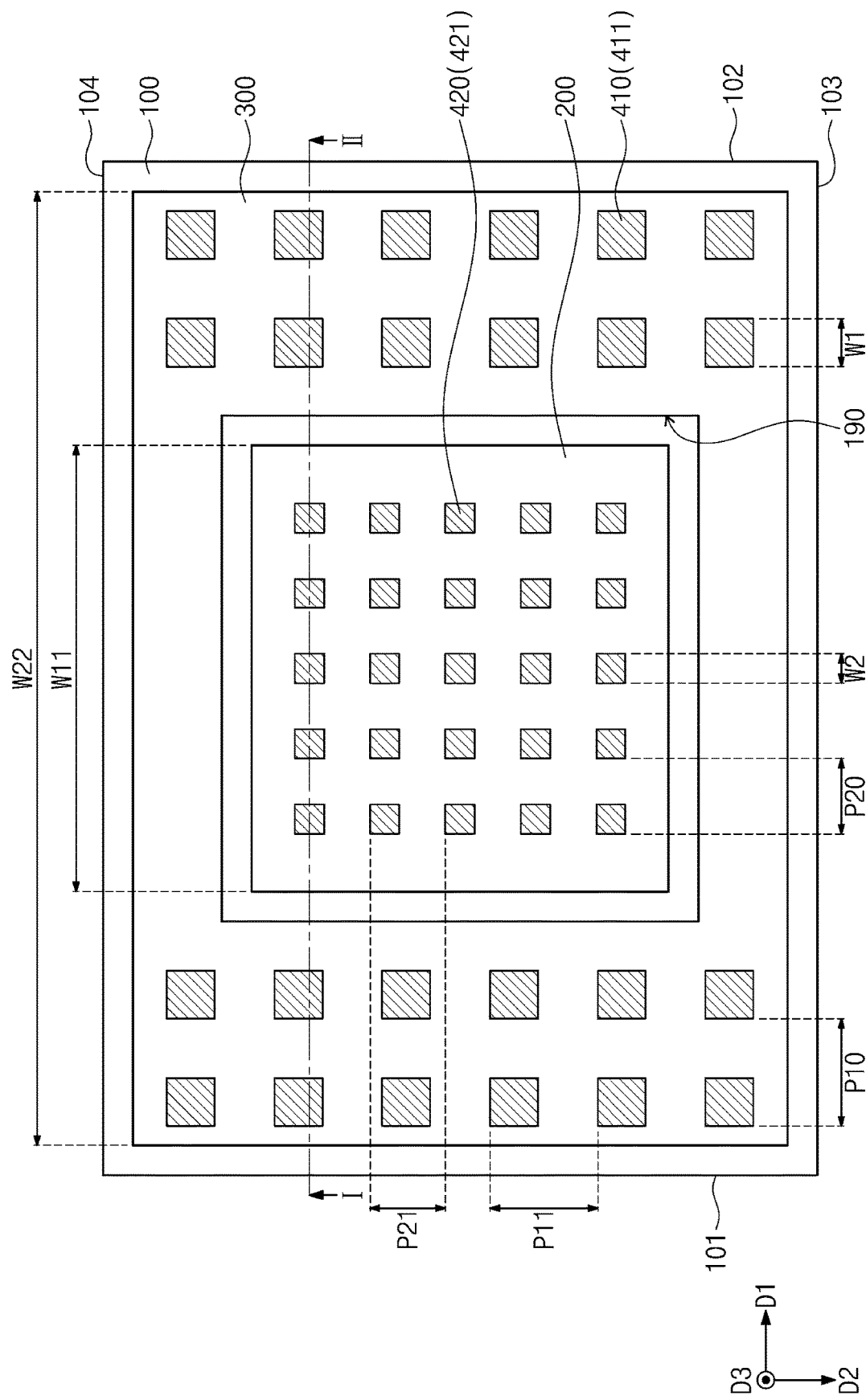
FIG. 1A illustrates a plan view showing a semiconductor package according to some example embodiments.

In this description, like reference numerals may indicate like components.

The following will now describe semiconductor packages according to the present inventive concepts.

Figure 1B:
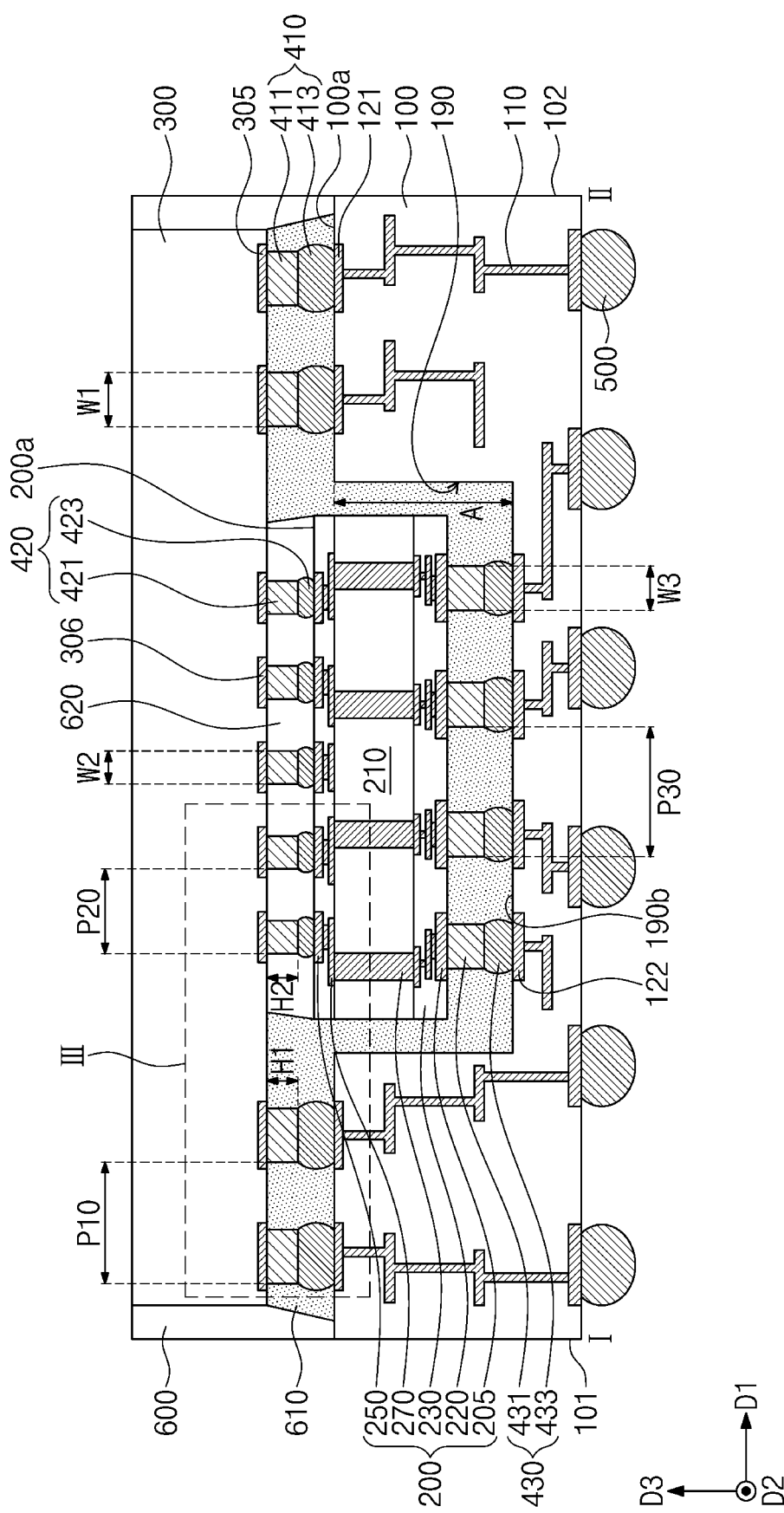
FIG. 1B illustrates a cross-sectional view taken along line I-II of FIG. 1A.
Figure 1C:
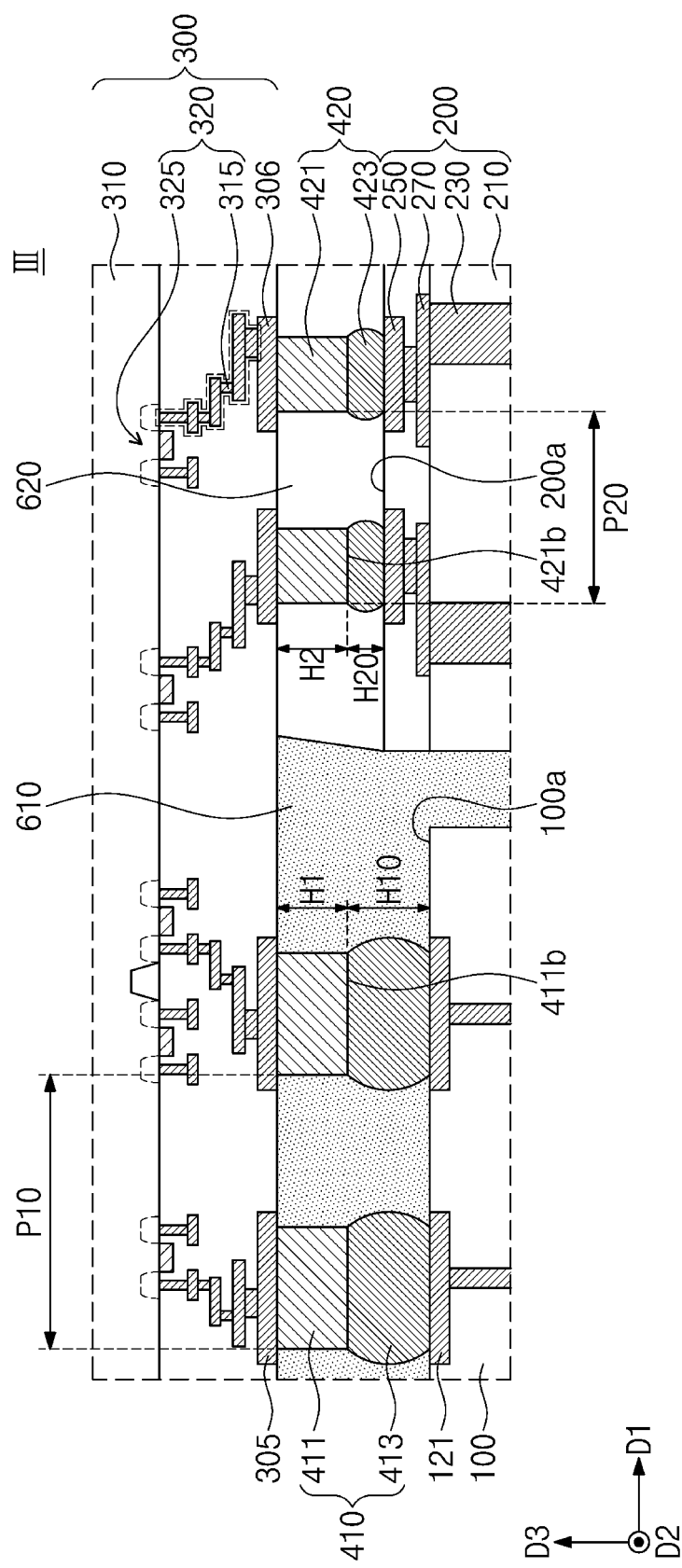
FIG. 1C illustrates an enlarged view showing section III of FIG. 1B.

FIG. 1A illustrates a plan view showing a semiconductor package according to some example embodiments. FIG. 1B illustrates a cross-sectional view taken along line I-II of FIG. 1A. FIG. 1C illustrates an enlarged view showing section III of FIG. 1B.

Referring to FIGS. 1A, 1B, and 1C, a semiconductor package may include a package substrate 100, a lower semiconductor chip 200, an upper semiconductor chip 300, lower bumps 430, first bumps 410, and second bumps 420.

The package substrate 100 may have a top surface 100a and a bottom surface opposite to each other. The package substrate 100 may have a recessed portion 190 on the top surface 100a thereof. For example, the recessed portion 190 may be provided in the package substrate 100 and may be opened to the top surface 100a of the package substrate 100. The recessed portion 190 may penetrate an upper portion of the package substrate 100. The recessed portion 190 may have a bottom surface 190b provided in the package substrate 100. For example, the bottom surface 190b of the recessed portion 190 may be located at a level lower than that of the top surface 100a of the package substrate 100 and higher than that of the bottom surface of the package substrate 100. The recessed portion 190 may have a depth A that is defined by a difference in level between the top surface 100a of the package substrate 100 and the bottom surface 190b of the recessed portion 190. The depth of the recessed portion 190 may be in a range from about 50 μm to about 300 μm. In this description, the language "level" may indicate "vertical level", and the expression "difference in level" may be measured in a direction parallel to a third direction D3. A first direction D1 may be parallel to the top surface 100a of the package substrate 100. A second direction D2 may be parallel to the top surface 100a of the package substrate 100, and may intersect the first direction D1. The third direction D3 may be substantially perpendicular to the top surface 100a of the package substrate 100. As shown in FIG. 1A, when viewed in plan, the recessed portion 190 may be formed on a central portion of the package substrate 100. Terms such as "perpendicular," "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The package substrate 100 may include a dielectric base layer, internal lines 110, first substrate pads 121, and second substrate pads 122. The dielectric base layer may include a single layer or a plurality of layers. The first substrate pads 121 may be disposed on the top surface 100a of the package substrate 100. The second substrate pads 122 may be disposed on the bottom surface 190b of the recessed portion 190. The first and second substrate pads 121 and 122 may include metal, such as one or more of aluminum, copper, tungsten, and titanium. The internal lines 110 may be provided in the package substrate 100 and may be coupled to the first substrate pads 121 or the second substrate pads 122. The phrase "two components are electrically connected/coupled to each other" may include the meaning that the two components are connected/coupled directly to each other or indirectly to each other through a different conductive component. In this description, the phrase "electrically connected to the package substrate 100" may mean "electrically connected to the internal line 110." The internal lines 110 may include metal, such one or more of tungsten and titanium. For example, the package substrate 100 may be a printed circuit board having a circuit pattern, but the present inventive concepts are not limited thereto.

The semiconductor package may further include solder terminals 500. The solder terminals 500 may be provided on the bottom surface of the package substrate 100 and may be coupled to the internal lines 110. External electrical signals may be transmitted through the solder terminals 500 to the internal lines 110. The solder terminals 500 may be solder balls and may include metal, such as a solder material. The solder material may include tin (Sn), silver (Ag), zinc (Zn), or any alloy thereof.

The lower semiconductor chip 200 may be provided in the recessed portion 190 of the package substrate 100. The lower semiconductor chip 200 may be, for example, a memory chip, but the present inventive concepts are not limited thereto. The lower semiconductor chip 200 may include a first semiconductor substrate 210, a first circuit layer 220, first chip pads 205, through structures 230, redistribution patterns 270, and conductive pads 250. The first circuit layer 220 may be disposed on a bottom surface of the first semiconductor substrate 210. The first circuit layer 220 may include first integrated circuits and first wiring structures. For example, the first integrated circuits may include memory circuits. The first chip pads 205 may be disposed on a bottom surface of the lower semiconductor chip 200. For example, the first chip pads 205 may be disposed on a bottom surface of the first circuit layer 220. The first chip pads 205 may be electrically connected through the first wiring structures to the first integrated circuits. In this description, the phrase "electrically connected to a semiconductor chip" may mean "electrically connected to integrated circuits of a semiconductor chip." For brevity, the illustration and description of the first circuit layer 220 will be omitted from drawings other than FIGS. 1B and 1C, but the present inventive concepts are not limited to particular examples.

The through structures 230 may be provided in the lower semiconductor chip 200. Each of the through structures 230 may penetrate the first semiconductor substrate 210. The through structures 230 may be electrically connected to the first chip pads 205 or the first integrated circuits. The through structures 230 may include a conductive material, such as one or more of copper, titanium, and tantalum. The through structures 230 may be through silicon vias.

The redistribution patterns 270 may be provided on a top surface of the first semiconductor substrate 210. The redistribution patterns 270 may be provided on top surfaces of corresponding through structures 230 to have electrical connection with the corresponding through structures 230. At least one of the redistribution patterns 270 may have a major axis parallel to the first direction D1 or the second direction D2. The redistribution patterns 270 may include metal, such as copper, titanium, or any alloy thereof. A dielectric passivation layer may further be provided on a top surface of the first semiconductor substrate 210, thereby covering the redistribution patterns 270.

The conductive pads 250 may be disposed on and electrically connected to corresponding redistribution patterns 270. The conductive pads 250 may be exposed on a top surface 200a of the lower semiconductor chip 200. Because the redistribution patterns 270 are provided, an arrangement of the chip pads 205 may not affect that of the conductive pads 250. For example, the conductive pads 250 may have a planar arrangement different from that of the first chip pads 205. At least one of the conductive pads 250 may not be aligned in the third direction D3 with the first chip pad 205 electrically connected thereto. The conductive pads 250 may include metal, such as aluminum, copper, titanium, or any alloy thereof.

The lower bumps 430 may be interposed between and electrically connected to the package substrate 100 and the lower semiconductor chip 200. For example, the lower bumps 430 may be interposed between the bottom surface 190b of the recessed portion 190 and the bottom surface of the lower semiconductor chip 200, and may be correspondingly coupled to the second substrate pads 122 and the first chip pads 205. The lower bumps 430 may include lower solder parts 433 and lower pillar patterns 431. The lower pillar patterns 431 may be disposed on and coupled to bottom surface of corresponding first chip pads 205. The lower solder parts 433 may be correspondingly interposed between and coupled to the second substrate pads 122 and the lower pillar patterns 431. The lower solder parts 433 may include a material different from that of the second substrate pads 122 and that of the lower pillar patterns 431. For example, the lower solder parts 433 may include a solder material. The lower pillar patterns 431 may include metal, such as copper.

The upper semiconductor chip 300 may be disposed on the lower semiconductor chip 200 and the package substrate 100. The upper semiconductor chip 300 may be of a different type from the lower semiconductor chip 200. For example, the upper semiconductor chip 300 may be a logic chip, and the lower semiconductor chip 200 may be a memory chip. The upper semiconductor chip 300 may have a width W22 greater than a width W11 of the lower semiconductor chip 200. The width W22 of the upper semiconductor chip 300 may be greater than a width of the recessed portion 190 in the package substrate 100. A width of a certain component may be measured in a direction parallel to the first direction D1. As shown in FIG. 1A, the upper semiconductor chip 300 may have a length greater than that of the lower semiconductor chip 200. The length of the upper semiconductor chip 300 may be greater than that of the recessed portion 190 of the package substrate 100. A length of a certain component may be measured in a direction parallel to the second direction D2. The upper semiconductor chip 300 may have a planar area greater than that of the lower semiconductor chip 200. When viewed in a plan view, the upper semiconductor chip 300 may completely overlap the lower semiconductor chip 200 in a vertical direction (i.e., the third direction D3). The upper semiconductor chip 300 may vertically overlap at least a portion of the top surface 100a of the package substrate 100.

As illustrated in FIG. 1C, the upper semiconductor chip 300 may include first upper chip pads 305, second upper chip pads 306, a second circuit layer 320, and a second semiconductor substrate 310. For example, the second circuit layer 320 may be disposed on a bottom surface of the second semiconductor substrate 310. The second circuit layer 320 may include second integrated circuits 325 and second wiring structures 315. The second integrated circuits 325 may be of a different type from the first integrated circuits. For example, the second integrated circuits 325 may include logic circuits. The first and second upper chip pads 305 and 306 may be disposed on a bottom surface of the second circuit layer 320 and may be exposed on a bottom surface of the upper semiconductor chip 300. The bottom surface of the upper semiconductor chip 300 may correspond to that of the second circuit layer 320. The first upper chip pads 305 and the second upper chip pads 306 may be electrically connected through the second wiring structures 315 to the second integrated circuits 325. The first upper chip pads 305 and the second upper chip pads 306 may include or be formed of metal, such as aluminum, copper, or any alloy thereof. For brevity, the illustration and description of the second integrated circuits 325 and the second wiring structures 315 will be omitted from drawings other than FIG. 1C, but the present inventive concepts are not limited to particular examples.

The first upper chip pads 305 may be disposed on a bottom surface at an edge region of the upper semiconductor chip 300. The first upper chip pads 305 may vertically overlap the top surface 100a of the package substrate 100. The second upper chip pads 306 may be disposed on a bottom surface at a central region of the upper semiconductor chip 300. The second upper chip pads 306 may vertically overlap the lower semiconductor chip 200. When viewed in plan, the edge region of the upper semiconductor chip 300 may surround the central region of the upper semiconductor chip 300. The second upper chip pads 306 may have a pitch less than that of the first upper chip pads 305.

The first bumps 410 may be interposed directly between and electrically connected to the package substrate 100 and the upper semiconductor chip 300. For example, the first bumps 410 may be correspondingly interposed directly between and directly coupled to the first substrate pads 121 and the first upper chip pads 305. The first bumps 410 may include first solder parts 413 and first pillar patterns 411. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Other words used to describe the relationship between elements should be interpreted in a like fashion (e.g., "between" versus "directly between," "adjacent" versus "directly adjacent," etc.).

The first upper chip pads 305 may be provided on their bottom surfaces with the first pillar patterns 411 that are correspondingly coupled thereto. The first pillar patterns 411 may be correspondingly interposed between the first solder parts 413 and the first upper chip pads 305. The first pillar patterns 411 may have the same height H1. For example, the first pillar patterns 411 may have their bottom surfaces 411b located at substantially the same level. In this description, the phrase "certain two components have the same height, width, length, and/or level," may mean "the certain two components are the same in the range of allowable error in height, width, length, and/or level." The first pillar patterns 411 may include a different material from that of the first upper chip pads 305, but the present inventive concepts are not limited thereto. For example, the first pillar patterns 411 may include metal, such as copper, titanium, or any alloy thereof.

The first solder parts 413 may be correspondingly disposed on the first substrate pads 121. For example, the first solder parts 413 may be correspondingly interposed between the first substrate pads 121 and second pillar patterns 421 which will be discussed below. The first solder parts 413 may be directly coupled to the first substrate pads 121. The first solder parts 413 may include a different material from that of the first substrate pads 121 and that of the first pillar patterns 411. For example, the first solder parts 413 may include a solder material.

As shown in FIG. 1B, the first bumps 410 may have a first pitch P10. The first pitch P10 may be measured in the first direction D1. The first pitch P10 may be in a range from about 90 µm to about 200 µm. The first pitch P10 of the first bumps 410 may indicate a pitch of the first pillar patterns 411. In this description, the term "pitch" may denote a period of repeatedly arranged components. For example, the language "pitch" may refer to a distance between sidewalls of two neighboring ones of the repeatedly arranged components. The sidewall of the two neighboring components may be directed in the same direction. As illustrated in FIG. 1A, the package substrate 100 may have a first lateral surface 101, a second lateral surface 102, a third lateral surface 103, and a fourth lateral surface 104. The second lateral surface 102 may stand opposite to the first lateral surface 101. The third lateral surface 103 may stand opposite to the fourth lateral surface 104, and may neighbor the first lateral surface 101 and the second lateral surface 102. The first bumps 410 may be divided into a first group and a second group. When viewed in plan, the first bumps 410 of the first group may be provided between the recessed portion 190 and the first lateral surface 101 of the package substrate 100. The first bumps 410 of the second group may be provided between the recessed portion 190 and the second lateral surface 102 of the package substrate 100. The first pitch P10 may be a pitch in the first direction D1 between the first bumps 410 of the first group or between the first bumps 410 of the second group.

The first bumps 410 may have a third pitch P11. The third pitch P11 may be measured in a direction parallel to the second direction D2. The third pitch P11 may be substantially the same as the first pitch P10. Alternatively, the third pitch P11 may be different from the first pitch P10. The third pitch P11 may in a range from about 90 µm to about 200 µm.

In fabrication of semiconductor packages, a difference in thermal expansion coefficient between the package substrate 100 and the upper semiconductor chip 300 may produce warpage of the package substrate 100 and the upper semiconductor chip 300. When each of the first and third pitches P10 and P11 is less than about 90 µm, the warpage may compel the first bumps 410 to have difficulty in being connected to the first substrate pads 121 or the first upper chip pads 305. According to some example embodiments, because each of the first and third pitches P10 and P11 is equal to or greater than about 90 µm, the first bumps 410 may be satisfactorily coupled to the first substrate pads 121 and the first upper chip pads 305. Accordingly, the semiconductor package may be free of electrical connection failure. According to some example embodiments, because each of the first and third pitches P10 and P11 is equal to or less than about 200 µm, the upper semiconductor chip 300 may have a fine pitch, and the semiconductor package may be small in size.

Each of the first bumps 410 may have a first width W1. The first width W1 may be measured in the first direction D1. The first width W1 of the first bumps 410 may be a width of the first pillar patterns 411. The first width W1 may be in a range from about 30 µm to about 120 µm. Because the first width W1 is equal to or greater than about 30 µm, the first bumps 410 may be favorably coupled to first substrate pads 121 and the first upper chip pads 305. Because the first width W1 is equal to or less than about 120 µm, the semiconductor package may be compact-sized.

As shown in FIGS. 1B and 1C, the second bumps 420 may be directly interposed between and electrically connected to the lower semiconductor chip 200 and the upper semiconductor chip 300. For example, the second bumps 420 may be correspondingly interposed directly between and directly coupled to the conductive pads 250 and the second upper chip pads 306. The second bumps 420 may include second solder parts 423 and second pillar patterns 421.

The second upper chip pads 306 may be provided on their bottom surface with the second pillar patterns 421 that are correspondingly coupled to the second upper chip pads 306. The second pillar patterns 421 may include metal, such as copper, titanium, or any alloy thereof. The second pillar patterns 421 may include metal different from that of the second upper chip pads 306. The second pillar patterns 421 may have the same height H2. For example, the second pillar patterns 421 may have their bottom surfaces 421b located at substantially the same level. The heights H2 of the second pillar patterns 421 may be substantially the same as the heights H1 of the first pillar patterns 411. The bottom surfaces 421b of the second pillar patterns 421 may be located at substantially the same level as that of the bottom surfaces 411b of the first pillar patterns 411.

The second solder parts 423 may be disposed on corresponding conductive pads 250 of the lower semiconductor chip 200. For example, the second solder parts 423 may be correspondingly interposed between and coupled to the conductive pads 250 and the second pillar patterns 421. The second solder parts 423 may further extend onto lower sidewalls of corresponding second pillar patterns 421, but the present inventive concepts are not limited thereto. The second solder parts 423 may include a material different from that of the conductive pads 250 and that of the second pillar patterns 421. For example, the second solder parts 423 may include a solder material.

The top surface 100a of the package substrate 100 may be located at a lower level than that of the top surface 200a of the lower semiconductor chip 200. The first bump 410 may have a height greater than that of the second bump 420. The height of the first bump 410 may be the same as a sum of the height H1 of the first pillar pattern 411 and a height H10 of the first solder part 413. The second bump 420 may have a height the same as a sum of the height H2 of the second pillar pattern 421 and a height H20 of the second solder part 423.

The height H10 of each of the first solder parts 413 may be greater than the height H20 of each of the second solder parts 423. Each of the first solder parts 413 may have a volume greater than that of each of the second solder parts 423. Therefore, a first contact area between one of the first solder parts 413 and its corresponding first substrate pad 121 may be greater than a second contact area between one of the second solder parts 423 and its corresponding conductive pad 250. Even when warpage occurs on the package substrate 100 or the upper semiconductor chip 300, the upper semiconductor chip 300 may be favorably attached through the first bumps 410 to the first substrate pads 121.

The second bumps 420 may have a second pitch P20. The second pitch P20 may be measured in the first direction D1. The second pitch P20 of the second bumps 420 may indicate a pitch of the second pillar patterns 421. The second pitch P20 may be less than the first pitch P10. As shown in FIG. 1A, the second pitch P20 may be less than the third pitch P11. The second pitch P20 may be in a range from about 10 µm to about 150 µm.

As illustrated in FIG. 1A, the second bumps 420 may have a fourth pitch P21 measured in a direction parallel to the second direction D2. The fourth pitch P21 may be less than the first pitch P10 and the third pitch P11. The fourth pitch P21 may be substantially the same as the second pitch P20. Alternatively, the fourth pitch P21 may be different from the second pitch P20. The fourth pitch P21 may be in a range from about 10 µm to about 150 µm.

According to some example embodiments, the upper semiconductor chip 300 may have a large number of input/output terminals. For example, the total number of input/output terminals in the upper semiconductor chip 300 may be greater than that of input/output terminals in the lower semiconductor chip 200. Therefore, when the semiconductor package operates, an amount of heat generated from the upper semiconductor chip 300 may be greater than that of heat generated from the lower semiconductor chip 200. The upper semiconductor chip 300 may be disposed on the top surface 200a of the lower semiconductor chip 200, and thus heat generated from the upper semiconductor chip 300 may be discharged at high rate. Accordingly, the semiconductor package may improve in electrical characteristics.

The input/output terminals of the upper semiconductor chip 300 may include the first upper chip pads 305 and the second upper chip pads 306. The input/out terminals of the lower semiconductor chip 200 may include the first chip pads 205. A sum of the numbers of the first and second upper chip pads 305 and 306 may be greater than the number of the lower bumps 430. Thus, the number of the first bumps 410 and the number of the second bumps 420 may be greater than that of the lower bumps 430.

When the package substrate 100 does not have the recessed portion 190, the semiconductor package may have a relatively large height. For example, the height of the semiconductor package may be greater than a sum of heights of the package substrate 100, the lower semiconductor chip 200, and the upper semiconductor chip 300. In addition, it may be difficult to connect the first upper chip pads 305 to the first substrate pads 121. According to some example embodiments, the package substrate 100 may have the recessed portion 190, and the lower semiconductor chip 200 may be provided in the recessed portion 190. The semiconductor package may accordingly be compact-sized. The upper semiconductor chip 300 may be coupled through the first bumps 410 to the package substrate 100, and thus a simple electrical connection may be provided between the upper semiconductor chip 300 and the package substrate 100.

Each of the second bumps 420 may have a second width W2. The second width W2 may be a width of the second pillar patterns 421. The second width W2 may be measured in the first direction D1. The second width W2 may be in a range, for example, from about 7 µm to about 70 µm. Because the second width W2 is equal to or greater than about 7 µm, the second bumps 420 may be relatively strong. Because the second width W2 is equal to or less than about 70 µm, the semiconductor package may be small in size.

According to some example embodiments, the second bumps 420 may have the second pitch P20 and the second width W2 each of which is relatively small, the second solder parts 423 may each have the relatively small height H20. The second upper chip pads 306 may thus be highly integrated.

The lower semiconductor chip 200 may include the conductive pads 250, and the second bumps 420 may be freely disposed without being limited to an arrangement of the lower bumps 430. For example, one or more of the second bumps 420 may not vertically overlap the lower bumps 430. The second pitch P20 of the second bumps 420 may be different from a pitch P30 of the lower bumps 430. Alternatively, the second pitch P20 may be the same as the pitch P30 of the lower bumps 430. For example, the pitch P30 of the lower bumps 430 may be the same as or greater than the second pitch P20. The pitch P30 of the lower bumps 430 may be a pitch of the lower pillar patterns 431. The lower bumps 430 may each have a width W3 the same as or greater than the second width W2. The width W3 of the lower bumps 430 may be a width of the lower pillar patterns 431.

The first pitch P10 of the first bumps 410 may correspond to a pitch in the first direction D1 of the first substrate pads 121 and to a pitch in the first direction D1 of the first upper chip pads 305. The second pitch P20 of the second bumps 420 may correspond to a pitch in the first direction D1 of the conductive pads 250 and to a pitch in the first direction D1 of the second upper chip pads 306. For example, the pitch of the conductive pads 250 may be less than the first pitch P10, the pitch of the first substrate pads 121, and the pitch of the first upper chip pads 305. The pitch of the second upper chip pads 306 may be less than the first pitch P10, the pitch of the first substrate pads 121, and the pitch of the first upper chip pads 305. The pitch of the first upper chip pads 305 may be greater than the second pitch P20, the pitch of the conductive pads 250, and the pitch of the second upper chip pads 306.

The first width W1 of the first bumps 410 may correspond to a width of the first substrate pads 121 and to a width of the first upper chip pads 305. The second width W2 of the second bumps 420 may correspond to a width of the conductive pads 250 and to a width of the second upper chip pads 306. For example, the width of the first upper chip pads 305 may be greater than the second width W2, the width of the conductive pads 250, and the width of the second upper chip pads 306. The width of the conductive pads 250 may be less than the first width W1, the width of the first substrate pads 121, and the width of the first upper chip pads 305. The width of the second upper chip pads 306 may be less than the first width W1, the width of the first substrate pads 121, and the width of the first upper chip pads 305.

The semiconductor package may further include at least one selected from a first under-fill layer 610, a second under-fill layer 620, and a molding layer 600. The first under-fill layer 610 may be provided in a first gap between the package substrate 100 and the upper semiconductor chip 300 and in a second gap between the recessed portion 190 and the lower semiconductor chip 200, thereby filling the first gap and the second gap. The first under-fill layer 610 may encapsulate the lower bumps 430 and the first bumps 410. The first under-fill layer 610 may include a dielectric polymer, such as an epoxy-based molding compound. Alternatively, a non-conductive film may be used to form the first under-fill layer 610.

The second under-fill layer 620 may further be included in the semiconductor package. The second under-fill layer 620 may be provided in a third gap between the top surface 200a of the lower semiconductor chip 200 and the bottom surface of the upper semiconductor chip 300, thereby filling the third gap. The second under-fill layer 620 may encapsulate the second bumps 420. The second under-fill layer 620 may include a dielectric polymer, such as an epoxy-based molding compound. Alternatively, a non-conductive film may be used to form the second under-fill layer 620. Differently from that shown, the second under-fill layer 620 may be omitted, and the first under-fill layer 610 may further extend into the third gap between the top surface 200a of the lower semiconductor chip 200 and the bottom surface of the upper semiconductor chip 300.

The package substrate 100 may be provided thereon with the molding layer 600 that covers sidewalls of the upper semiconductor chip 300. The molding layer 600 may expose a top surface of the upper semiconductor chip 300 (i.e., the molding layer 600 may not cover a top surface of the upper semiconductor chip 300, such that the upper semiconductor chip 300 is exposed). Alternatively, the molding layer 600 may further cover the top surface of the upper semiconductor chip 300. The molding layer 600 may include a dielectric polymer, such as an epoxy-based molding compound. The molding layer 600 may include a different material from that of the first under-fill layer 610 and that of the second under-fill layer 620.

Figure 1D:
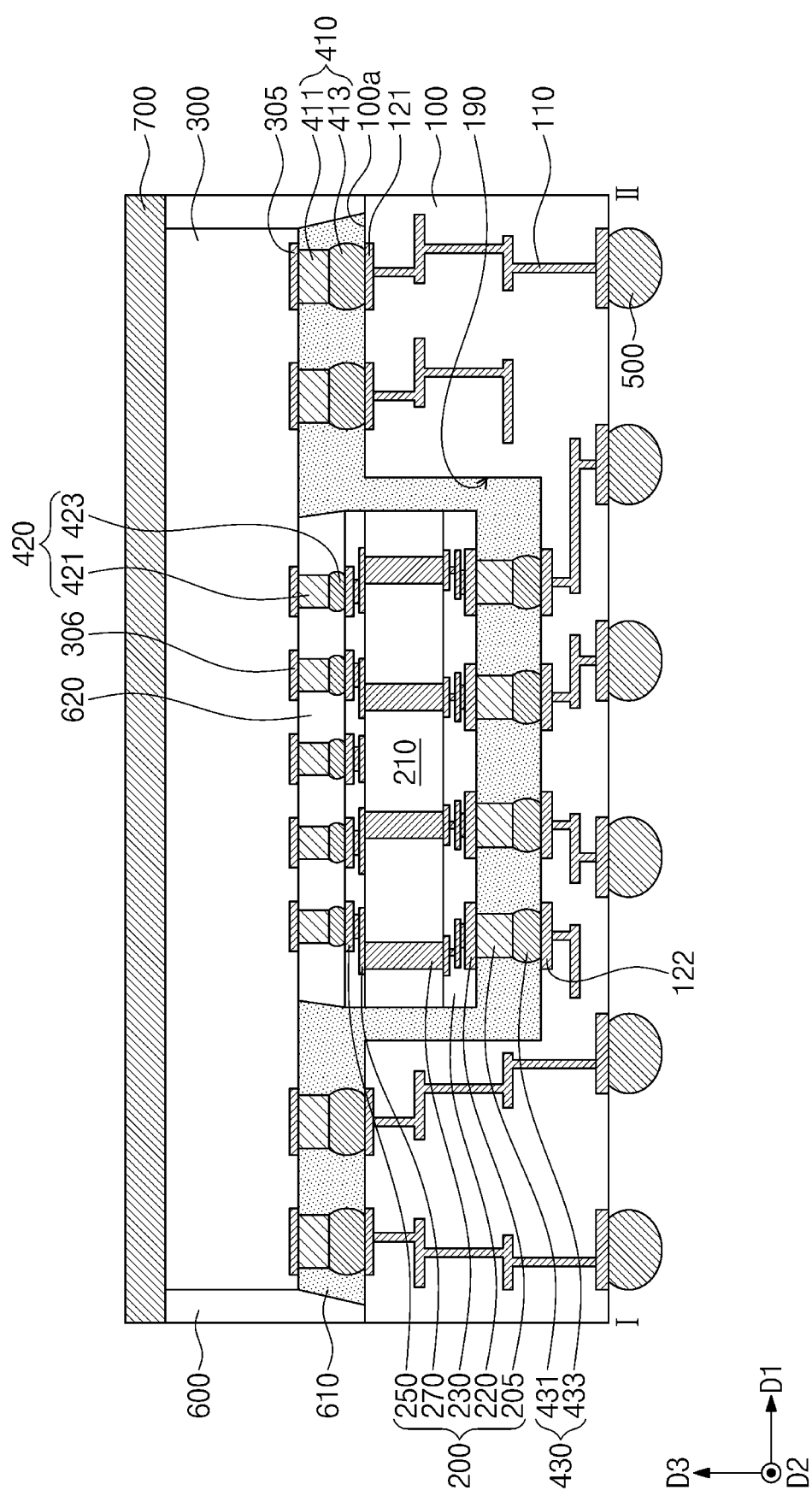
FIG. 1D illustrates a cross-sectional view showing a semiconductor package according to some example embodiments.

FIG. 1D illustrates a cross-sectional view which corresponds to that taken along line I-II of FIG. 1A, showing a semiconductor package according to some example embodiments.

Referring to FIG. 1D, a semiconductor package may include a package substrate 100, solder terminals 500, a lower semiconductor chip 200, lower bumps 430, an upper semiconductor chip 300, first bumps 410, second bumps 420, first and second under-fill layers 610 and 620, and a molding layer 600, and may further include a thermal radiation structure 700.

The thermal radiation structure 700 may be provided on a top surface of the upper semiconductor chip 300 and a top surface of the molding layer 600. The thermal radiation structure 700 may include a heat sink, a heat slug, or a thermal interface material (TIM) layer. The thermal radiation structure 700 may include, for example, metal.

Alternatively, the thermal radiation structure 700 may have an electrical conductivity and may serve as an electromagnetic shield layer. For example, the thermal radiation structure 700 may shield electromagnetic interference between the lower and upper semiconductor chips 200 and 300. The thermal radiation structure 700 may further extend onto a sidewall of the molding layer 600 and may be electrically grounded through the package substrate 100.

Figure 2:
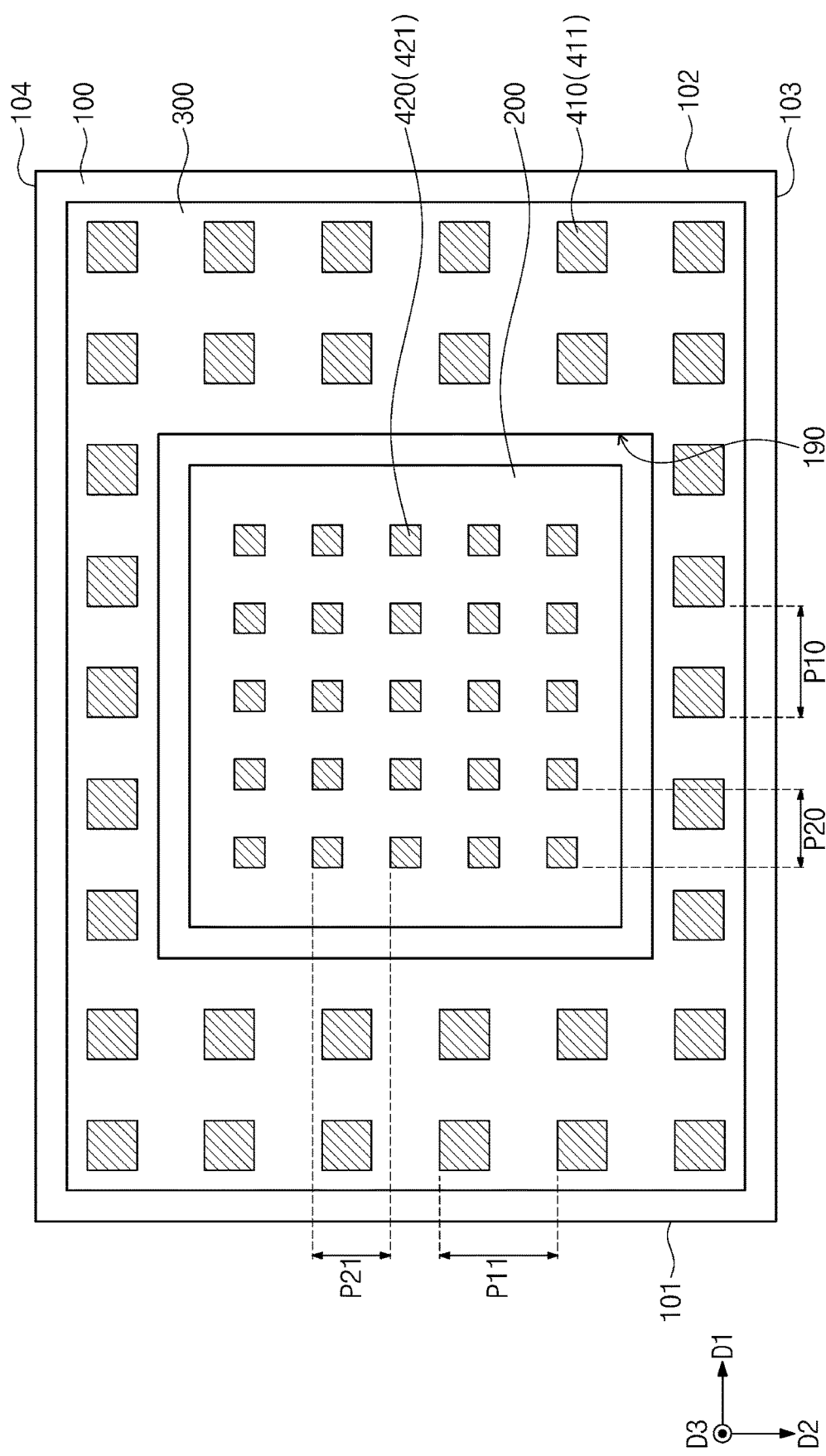
FIG. 2 illustrates a plan view showing an arrangement of first bumps according to some example embodiments.

FIG. 2 illustrates a plan view showing an arrangement of first bumps according to some example embodiments.

Referring to FIG. 2, a semiconductor package may include a package substrate 100, a lower semiconductor chip 200, an upper semiconductor chip 300, first bumps 410, and second bumps 420. The package substrate 100, the lower semiconductor chip 200, the upper semiconductor chip 300, the first bumps 410, and the second bumps 420 may be substantially the same as those discussed above.

In contrast, the first bumps 410 may be divided into a first group, a second group, and a third group. When viewed in plan, an arrangement of the first bumps 410 included in the first and second groups may be substantially identical to that discussed above. A first pitch P10, a second pitch P20, a third pitch P11, and a fourth pitch P21 may be the same as those discussed in the examples of FIGS. 1A and 1B. The first bumps 410 of the third group may be disposed between the recessed portion 190 and the third lateral surface 103 of the package substrate 100.

The first bumps 410 may further include first bumps 410 of a fourth group. The first bumps 410 of the fourth group may be disposed between the recessed portion 190 and the fourth lateral surface 104 of the package substrate 100.

For example, the first bumps 410 of the first group may constitute a plurality of columns, and the first bumps 410 of the second group may constitute a plurality of columns. Each of the columns may be parallel to the second direction D2. Alternatively, although not illustrated, the first bumps 410 of the first group may constitute a single column and the first bumps 410 of the second group may constitute a single column. The first bumps 410 of the third group may constitute a single row. The row may be parallel to the first direction D1. Alternatively, although not illustrated, the first bumps 410 of the third group may constitute two or more rows. A planar arrangement of the first bumps 410 is not limited to that shown, but may be variously changed.

Figure 3:
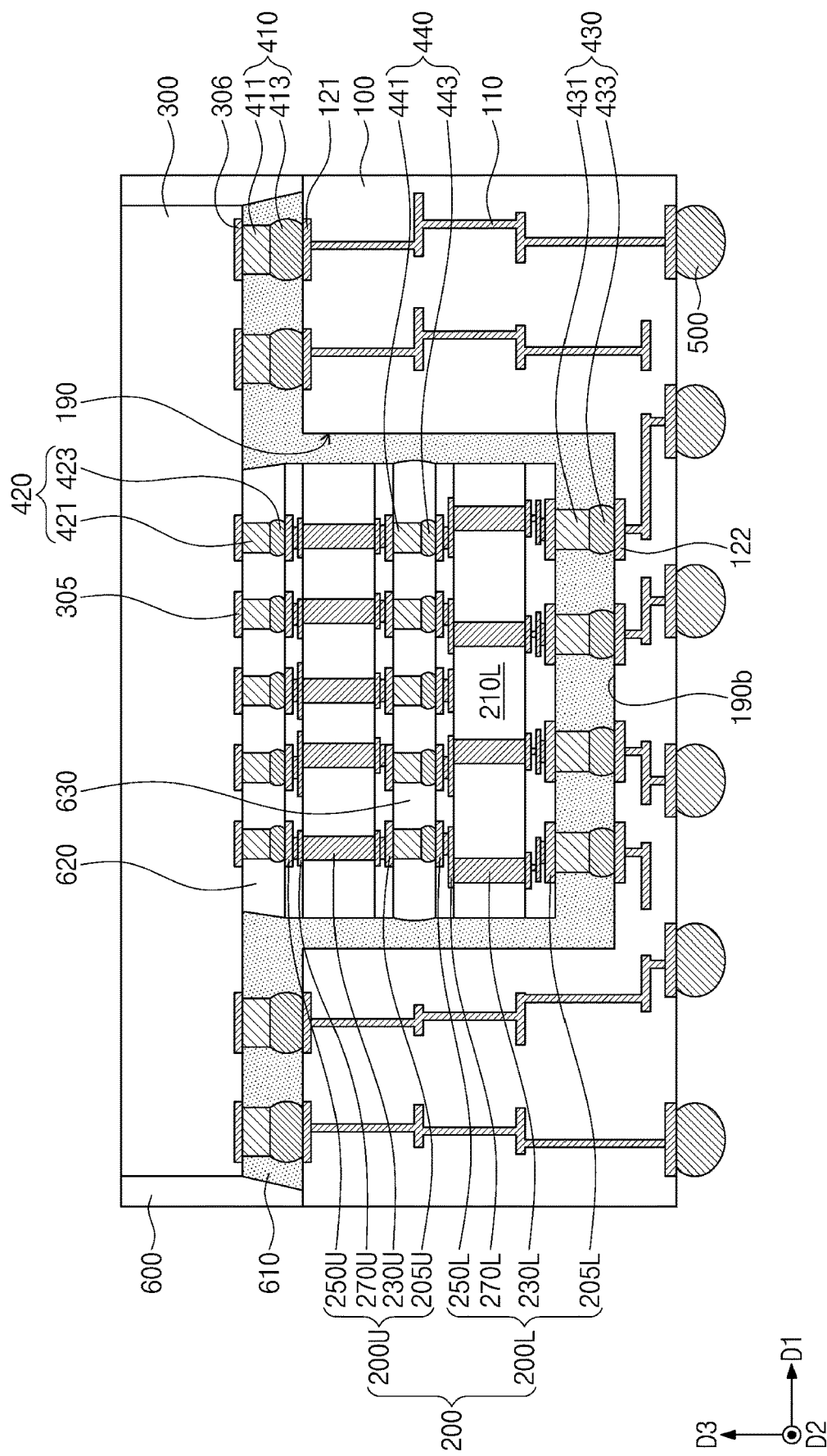
FIG. 3 illustrates a cross-sectional view showing a semiconductor package according to some example embodiments.

FIG. 3 illustrates a cross-sectional view which corresponds to that taken along line I-II of FIG. 1A, showing a semiconductor package according to an example embodiment. The following will refer, in part, to FIG. 1A in the explanation of FIG. 3.

Referring to FIG. 3, a semiconductor package may include a package substrate 100, a lower semiconductor chip 200, lower bumps 430, an upper semiconductor chip 300, first bumps 410, second bumps 420, third bumps 440, and a first under-fill layer 610. The package substrate 100, the upper semiconductor chip 300, the first bumps 410, and the second bumps 420 may be substantially the same as those discussed above.

The lower semiconductor chip 200 may include a first lower semiconductor chip 200L and a second lower semiconductor chip 200U that are stacked. The first lower semiconductor chip 200L may be disposed in the recessed portion 190 of the package substrate 100. The first lower semiconductor chip 200L may be a memory chip. The first lower semiconductor chip 200L may include a first lower semiconductor substrate 210L, a first lower circuit layer, first lower chip pads 205L, first through structures 230L, first redistribution patterns 270L, and first conductive pads 250L. The first lower semiconductor substrate 210L, the first lower circuit layer, the first lower chip pads 205L, the first through structures 230L, the first redistribution patterns 270L, and the first conductive pads 250L may be identical or similar to the first semiconductor substrate 210, the first circuit layer 220, the first chip pads 205, the through structures 230, the redistribution patterns 270, and the conductive pads 250 discussed in FIGS. 1A to 1C.

The lower bumps 430 may be interposed between a bottom surface of the first lower semiconductor chip 200L and a bottom surface 190b of the recessed portion 190, and may be correspondingly coupled to the second substrate pads 122 and the first lower chip pads 205L of the first lower semiconductor chip 200L.

The second lower semiconductor chip 200U may be disposed in the recessed portion 190 of the package substrate 100. The second lower semiconductor chip 200U may be placed on a top surface of the first lower semiconductor chip 200L. The second lower semiconductor chip 200U may be a memory chip. The second lower semiconductor chip 200U may include a second lower semiconductor substrate, a second lower circuit layer, second lower chip pads 205U, second through structures 230U, second redistribution patterns 270U, and second conductive pads 250U. The second lower semiconductor substrate, the second lower circuit layer, the second lower chip pads 205U, the second through structures 230U, the second redistribution patterns 270U, and the second conductive pads 250U may be identical or similar to the first semiconductor substrate 210, the first circuit layer 220, the first chip pads 205, the through structures 230, the redistribution patterns 270, and the conductive pads 250 discussed in FIGS. 1A to 1C.

The third bumps 440 may be interposed between the first lower semiconductor chip 200L and the second lower semiconductor chip 200U, and may be correspondingly coupled to the first conductive pads 250L and the second lower chip pads 205U. The third bumps 440 may include third solder parts 443 and third pillar patterns 441. The third pillar patterns 441 may be correspondingly disposed on and coupled to bottom surfaces of the second lower chip pads 205U. The third solder parts 443 may be provided between the first conductive pads 250L and the third pillar patterns 441. The second lower semiconductor chip 200U may be coupled through the third bumps 440 to the first lower semiconductor chip 200L and the package substrate 100.

The second bumps 420 may be interposed between the second lower semiconductor chip 200U and the upper semiconductor chip 300, and may be correspondingly coupled to the second conductive pads 250U and the second upper chip pads 306.

The first under-fill layer 610 may be provided in a first gap between a top surface of the package substrate 100 and a bottom surface of the upper semiconductor chip 300, and may also be provided in a second gap between the recessed portion 190 and the first lower semiconductor chip 200L and between the recessed portion 190 and the second lower semiconductor chip 200U. The first under-fill layer 610 may encapsulate the first bumps 410 and the lower bumps 430.

The semiconductor package may further include a second under-fill layer 620 and a third under-fill layer 630. The second under-fill layer 620 may be provided in a third gap between a top surface of the second lower semiconductor chip 200U and a bottom surface of the upper semiconductor chip 300, thereby encapsulating the second bumps 420. The third under-fill layer 630 may be provided in a fourth gap between the first lower semiconductor chip 200L and the second lower semiconductor chip 200U, thereby encapsulating the third bumps 440. Alternatively, the third under-fill layer 630 may be omitted, and the first under-fill layer 610 may further extend into the first gap, thereby further encapsulating the third bumps 440.

The lower semiconductor chip 200 may be configured such that the number of stacked semiconductor chips is variously changed. The semiconductor package may further include solder terminals 500 and a molding layer 600.

Figure 4A:
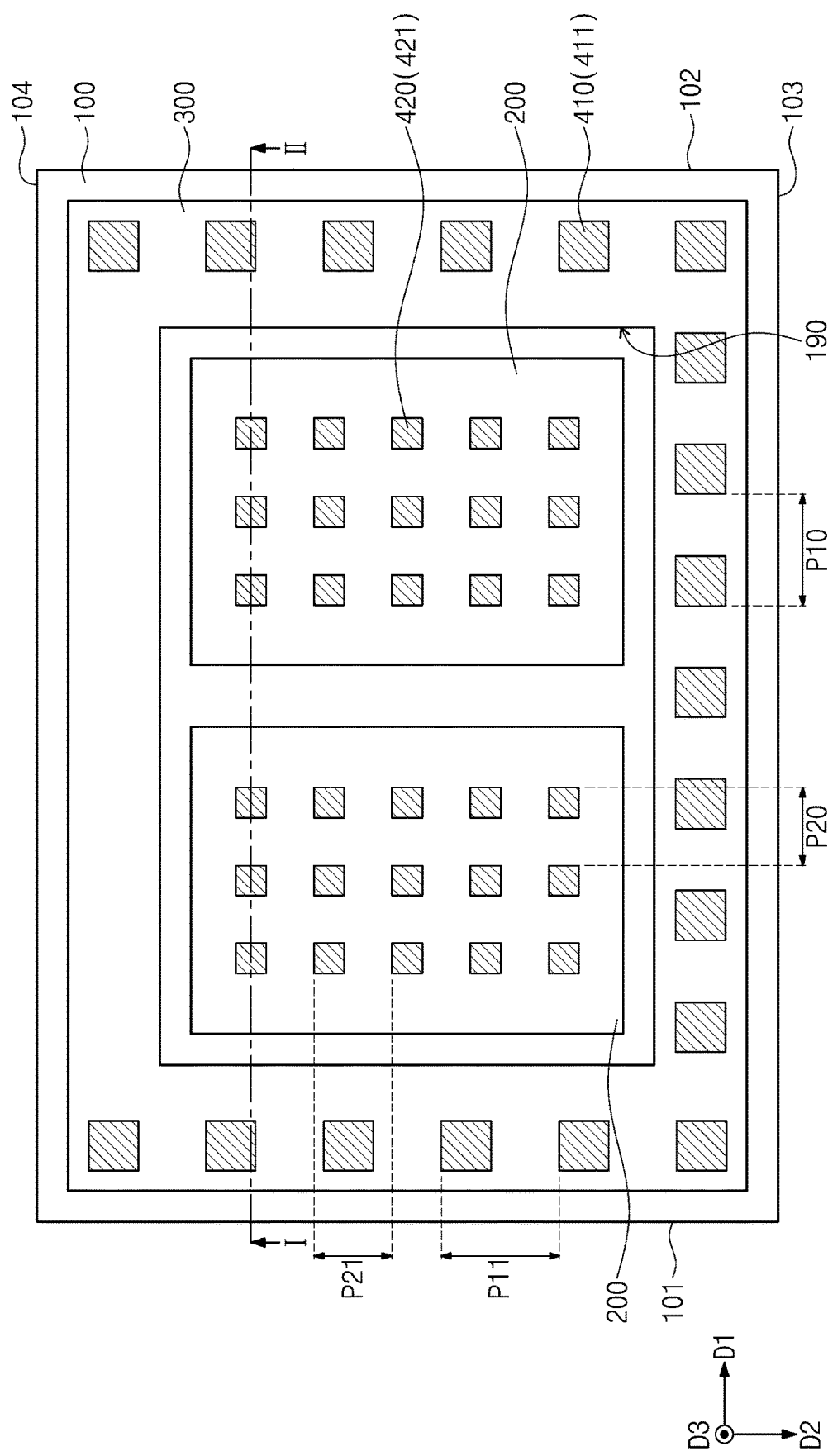
FIG. 4A illustrates a plan view showing a semiconductor package according to some example embodiments.
Figure 4B:
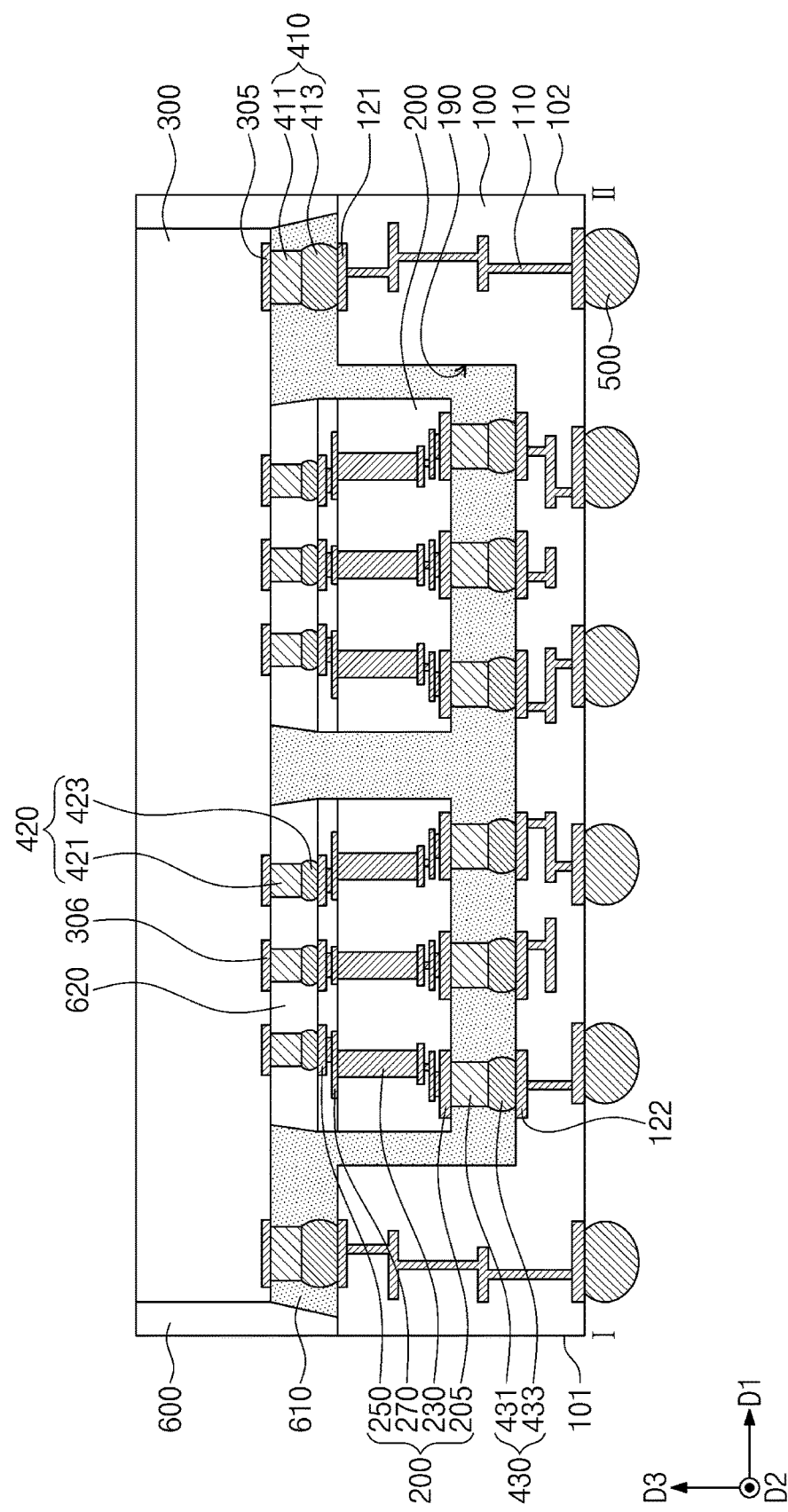
FIG. 4B illustrates a cross-sectional view taken along line I-II of FIG. 4A.

FIG. 4A illustrates a plan view showing a semiconductor package according to some example embodiments. FIG. 4B illustrates a cross-sectional view taken along line I-II of FIG. 4A.

Referring to FIGS. 4A and 4B, a semiconductor package may include a package substrate 100, a plurality of lower semiconductor chips 200, lower bumps 430, an upper semiconductor chip 300, first bumps 410, second bumps 420, and a first under-fill layer 610.

When viewed in plan, the first bumps 410 may be disposed between a recessed portion 190 and a first lateral surface 101 of the package substrate 100, between the recessed portion 190 and a second lateral surface 102 of the package substrate 100, and between the recessed portion 190 and a third lateral surface 103 of the package substrate 100. The first bumps 410 may not be provided between the recessed portion 190 and a fourth lateral surface 104 of the package substrate 100. A first pitch P10, a second pitch P20, a third pitch P11, and a fourth pitch P21 may be the same as those discussed in the examples of FIGS. 1A and 1B.

The lower semiconductor chips 200 may be spaced apart from each other in the recessed portion 190 of the package substrate 100. Each of the lower semiconductor chips 200 may be substantially the same as that discussed in the examples of FIGS. 1A to 1C. The lower semiconductor chips 200 may be memory chips. Each of the lower semiconductor chips 200 may include first chip pads 205, through structures 230, redistribution patterns 270, and conductive pads 250.

The lower bumps 430 may be correspondingly interposed between bottom surfaces of the lower semiconductor chips 200 and a bottom surface 190b of the recessed portion 190. The lower semiconductor chips 200 may be coupled through the lower bumps 430 to the upper semiconductor chip 300.

The second bumps 420 may be interposed between the lower semiconductor chips 200 and the upper semiconductor chip 300. The second bumps 420 may be coupled to the second upper chip pads 306 and the conductive pads 250 of each of the lower semiconductor chips 200. Therefore, the lower semiconductor chips 200 may be coupled through the second bumps 420 to the upper semiconductor chip 300.

A plurality of second under-fill layers 620 may be correspondingly provided in second gaps between the lower semiconductor chips 200 and the upper semiconductor chip 300, thereby encapsulating corresponding second bumps 420.

The first under-fill layer 610 may be provided in a first gap between a top surface of the package substrate 100 and a bottom surface of the upper semiconductor chip 300, and may also be provided in a second gap between the recessed portion 190 and the lower semiconductor chips 200. The first under-fill layer 610 may further extend between the lower semiconductor chips 200 and the second under-fill layers 620. Alternatively, the second under-fill layers 620 may be omitted, and the first under-fill layer 610 may further extend between the lower semiconductor chips 200 and the upper semiconductor chip 300, thereby encapsulating the second bumps 420.

The semiconductor package may further include solder terminals 500 and a molding layer 600.

The embodiments of a semiconductor package may be combined with each other. For example, it may be possible to combine with each other the embodiment of FIGS. 1A to 1C, the embodiment of FIG. 1D, the embodiment of FIG. 2, the embodiment of FIG. 3, and the embodiment of FIGS. 4A and 4B.

Figure 5A:
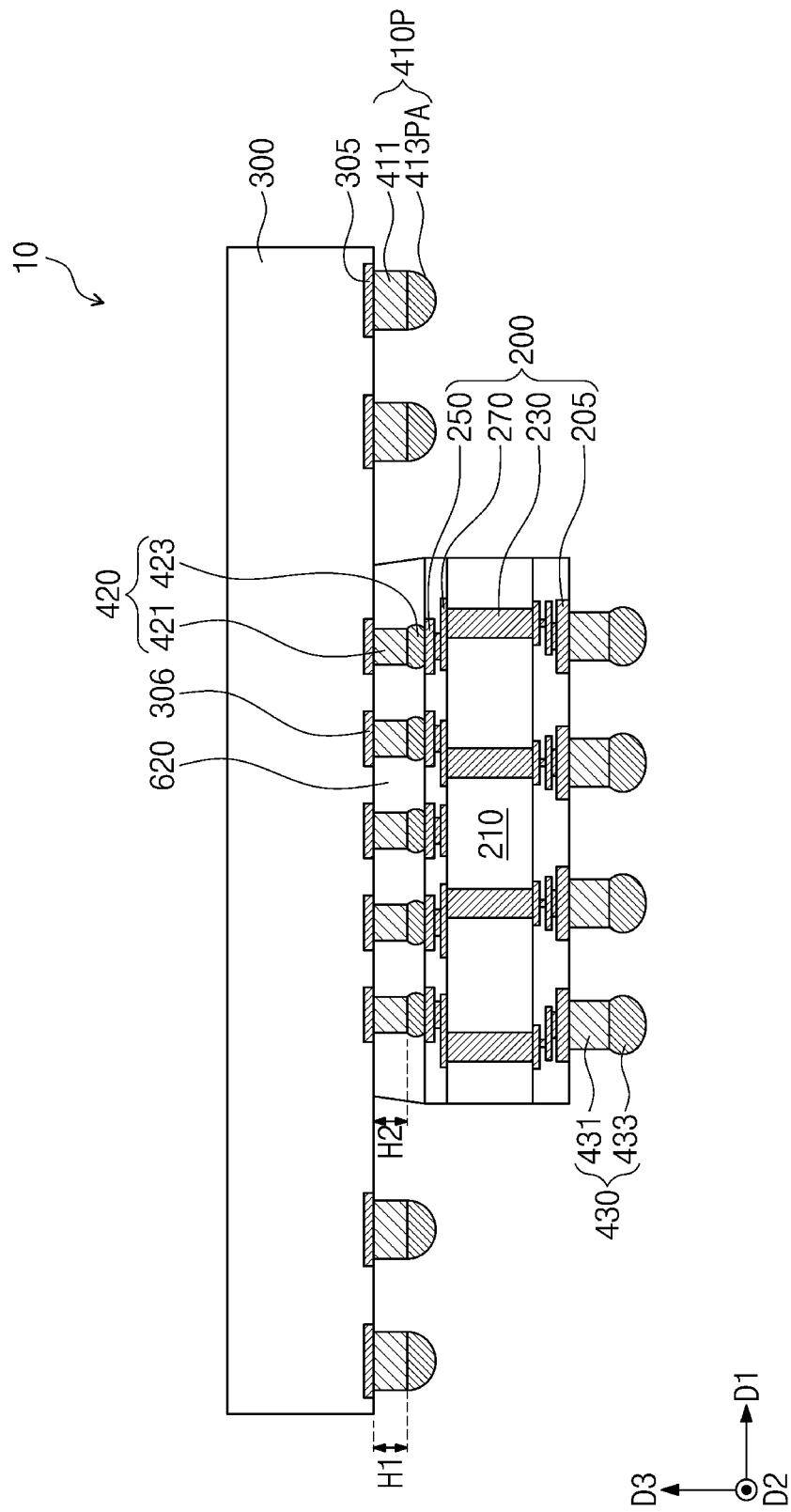
FIGS. 5A to 5C illustrate cross-sectional views showing a method of fabricating a semiconductor package according to some example embodiments.
Figure 5B:
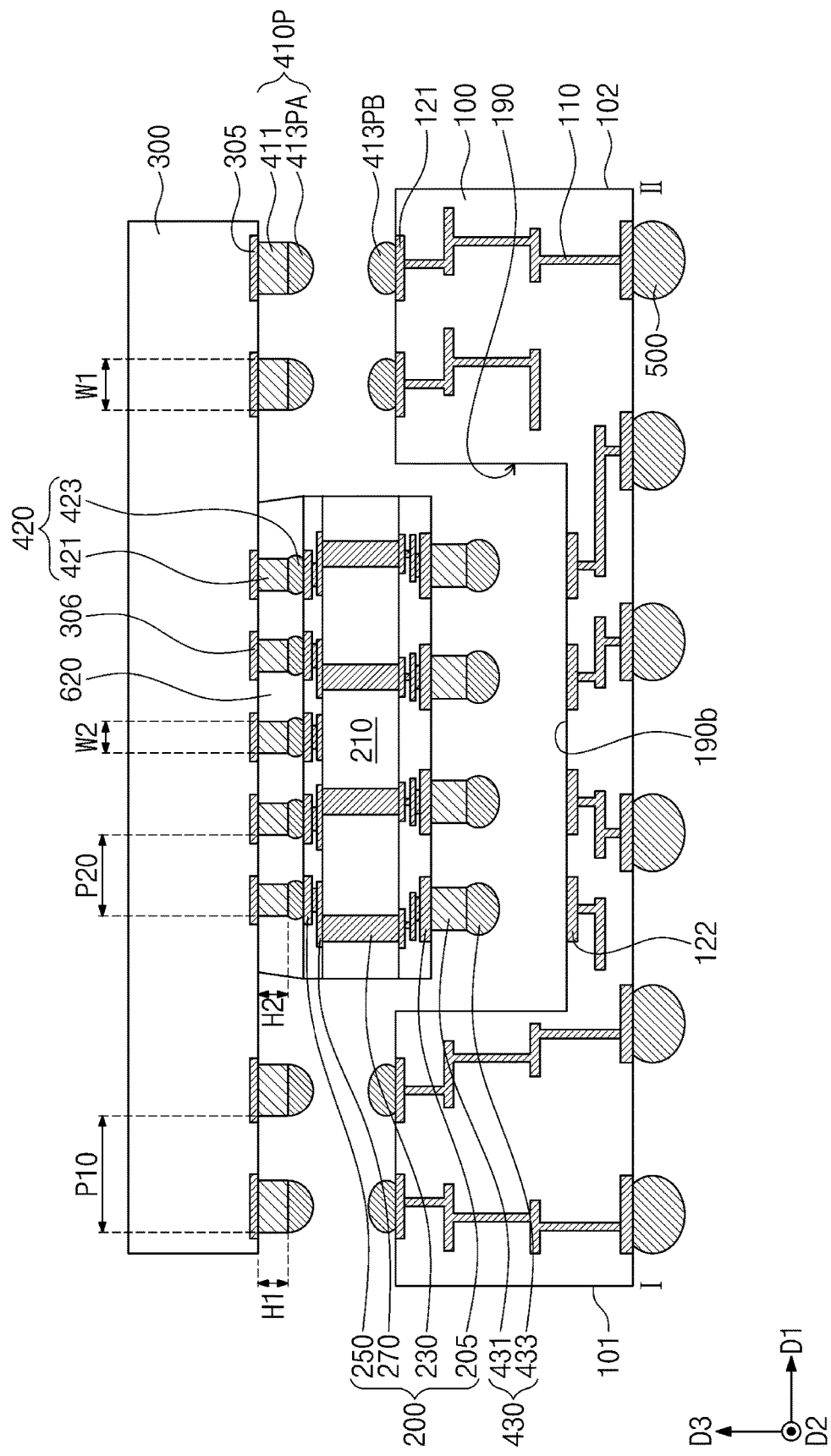
Figure 5C:
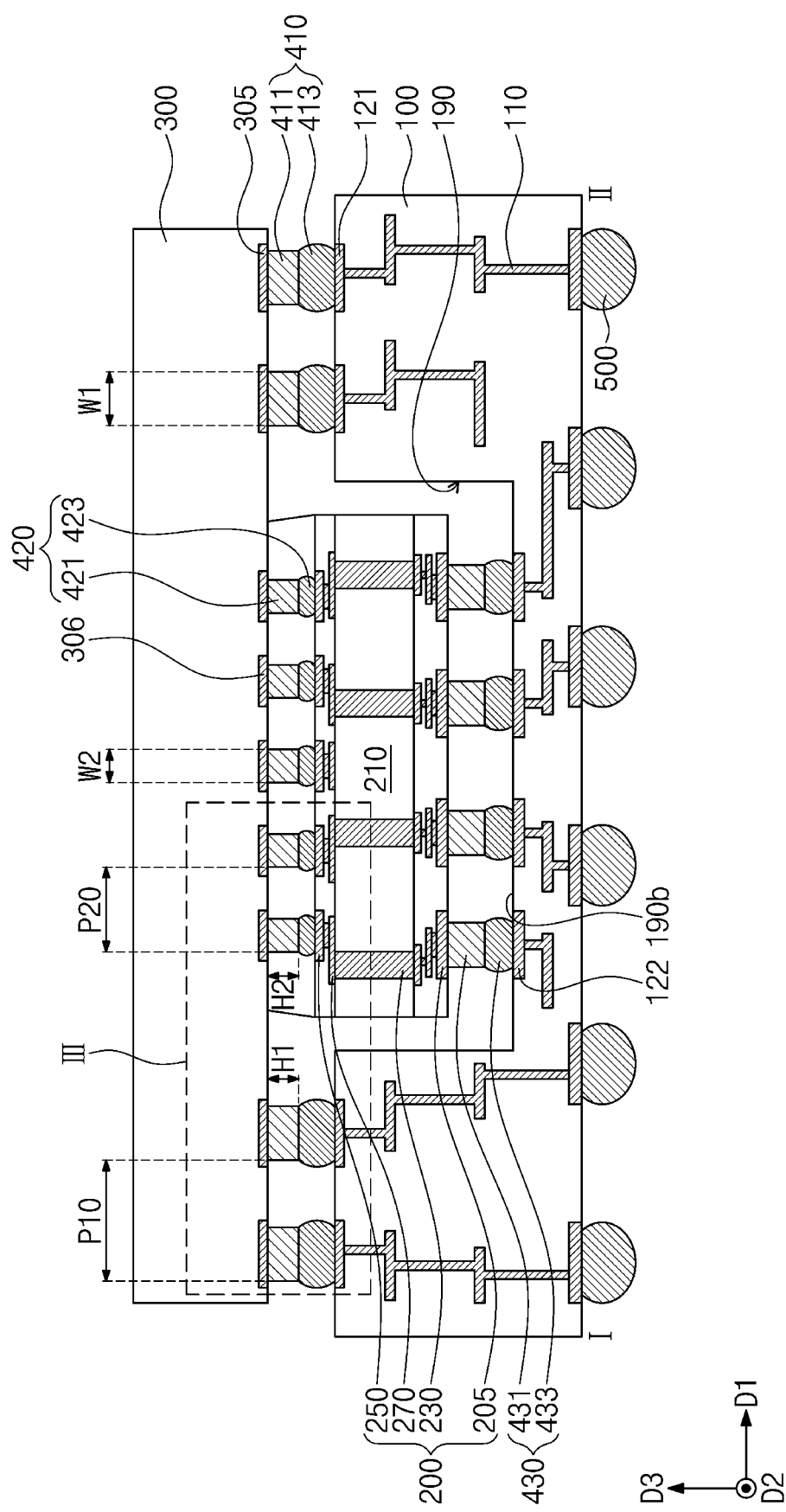
Figure 5D:
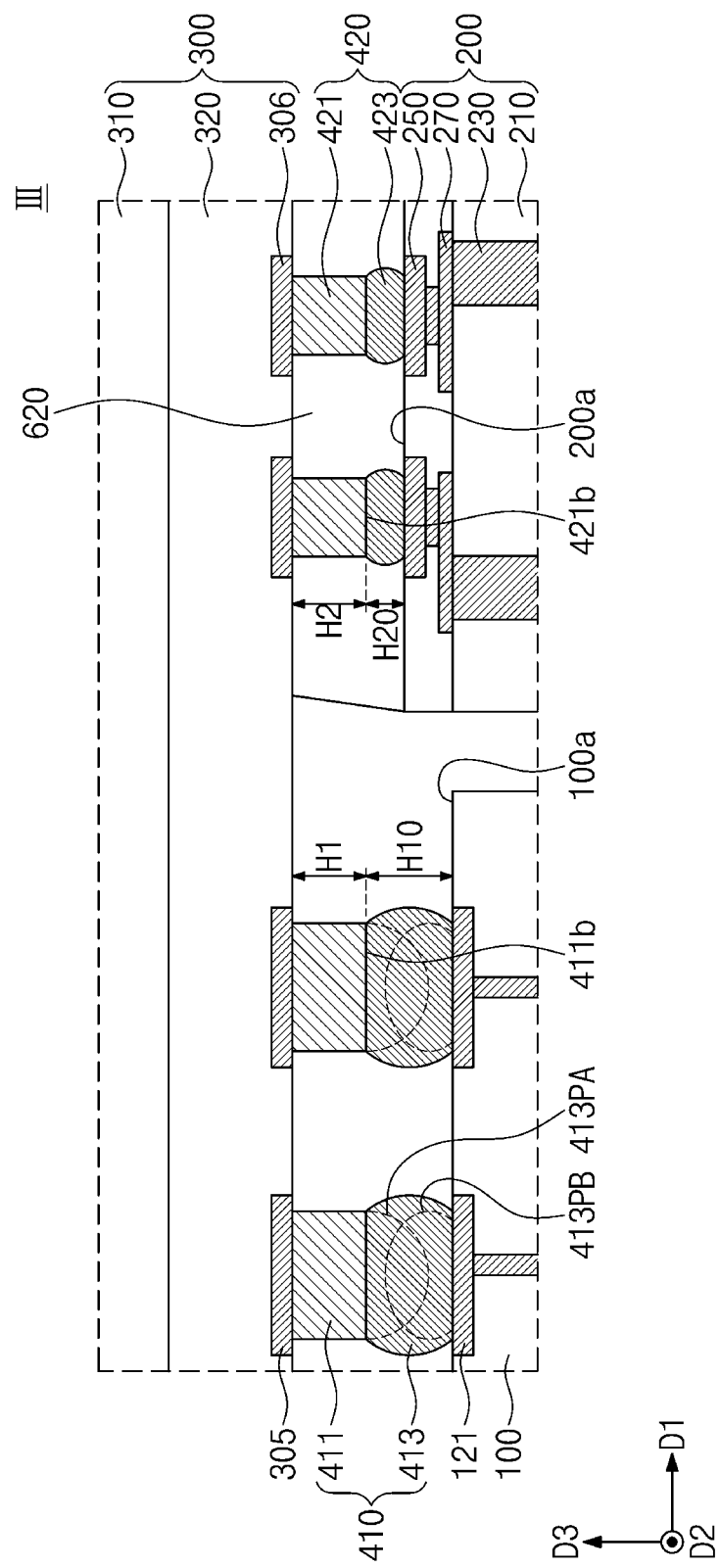
FIG. 5D illustrates an enlarged view showing section III of FIG. 5C.

FIGS. 5A to 5C illustrate cross-sectional views which correspond to that taken along line I-II of FIG. 1A, showing a method of fabricating a semiconductor package according to some example embodiments. FIG. 5D illustrates an enlarged view showing section III of FIG. 5C.

Referring to FIG. 5A, an upper semiconductor chip 300 may be prepared. The upper semiconductor chip 300 may be substantially the same as that discussed in the examples of FIGS. 1A to 1C. First pillar patterns 411 may be correspondingly formed on bottom surfaces of first upper chip pads 305. Second pillar patterns 421 may be correspondingly formed on bottom surfaces of second upper chip pads 306. The first pillar patterns 411 may have their heights H1 substantially the same as heights H2 of the second pillar patterns 421. Therefore, it may be possible to easily form the first pillar patterns 411 and second pillar patterns 421. For example, the first pillar patterns 411 and the second pillar patterns 421 may be formed in a single process.

Second solder parts 423 may be correspondingly formed on bottom surfaces of the second pillar patterns 421, and thus second bumps 420 may be formed. Preliminary upper solder parts 413PA may be correspondingly formed on bottom surfaces of the first pillar patterns 411, and thus first preliminary bumps 410P may be formed. The first preliminary bumps 410P may include first pillar patterns 411 and preliminary upper solder parts 413PA.

Lower bumps 430 and a lower semiconductor chip 200 may be prepared. In this step, the lower bumps 430 may be correspondingly formed on a bottom surface of the lower semiconductor chip 200, and may be correspondingly coupled to first chip pads 205 of the lower semiconductor chip 200. The lower bumps 430 may include lower solder parts 433 and lower pillar patterns 431.

The lower semiconductor chip 200 may be mounted on a bottom surface of the upper semiconductor chip 300, which may result in the formation of a chip stack 10. For example, the lower semiconductor chip 200 may be disposed on the bottom surface of the upper semiconductor chip 300, such that conductive pads 250 of the lower semiconductor chip 200 may be aligned with corresponding second bumps 420. A first reflow process may be performed in which the second solder parts 423 of the second bumps 420 are connected to corresponding conductive pads 250. Therefore, the upper semiconductor chip 300 may be coupled through the second bumps 420 to the lower semiconductor chip 200. The chip stack 10 may include the lower semiconductor chip 200, the second bumps 420, the upper semiconductor chip 300, the first preliminary bumps 410P, and the lower bumps 430.

A second under-fill layer 620 may further be formed between the lower semiconductor chip 200 and the upper semiconductor chip 300, thereby encapsulating the second bumps 420. The chip stack 10 may further include the second under-fill layer 620.

Referring to FIG. 5B, a package substrate 100 may be prepared which has a recessed portion 190. The package substrate 100 may include first substrate pads 121 and second substrate pads 122. Preliminary lower solder parts 413PB may be correspondingly formed on the first substrate pads 121. The preliminary lower solder parts 413PB may include a solder material. Although not shown, preliminary solder parts may further be formed on corresponding second substrate pads 122 of the package substrate 100.

The chip stack 10 may be disposed on the package substrate 100. For example, the lower semiconductor chip 200 may be provided in the recessed portion 190 of the package substrate 100, and the upper semiconductor chip 300 may be disposed on a top surface of the package substrate 100. In this step, the lower bumps 430 may be vertically aligned with corresponding second substrate pads 122, and the first preliminary bumps 410P may be vertically aligned with corresponding first substrate pads 121.

Referring to FIGS. 5C and 5D, the upper semiconductor chip 300 may descend to allow the first preliminary bumps 410P and the lower bumps 430 to contact the first substrate pads 121 and the second substrate pads 122, respectively. Afterwards, a second reflow process may be performed. The second reflow process may include annealing the first preliminary bumps 410P, the preliminary lower solder parts 413PB, and the lower bumps 430. For example, the second reflow process may be executed at a temperate equal to or higher than melting points of the preliminary upper solder parts 413PA, the preliminary lower solder parts 413PB, and the lower solder parts 433. The second reflow process may allow the lower solder parts 433 to have connection with corresponding second substrate pads 122. Therefore, the lower semiconductor chip 200 may be electrically connected to the package substrate 100.

The second reflow process may correspondingly connect the preliminary upper solder parts 413PA to the preliminary lower solder parts 413PB, and first solder parts 413 may thus be formed. Subsequently, the preliminary upper solder parts 413PA and the preliminary lower solder parts 413PB may have indistinct interfaces therebetween. Accordingly, first bumps 410 may be formed. The first bumps 410 may include first solder parts 413 and first pillar patterns 411. The first pillar patterns 411 have a first pitch P10 and a first width W1 each of which is relatively large, and therefore even when warpage occurs on the package substrate 100 or the upper semiconductor chip 300 in the second reflow process, the first solder parts 413 may be satisfactorily connected to the first substrate pads 121 and the first pillar patterns 411. The amount of warpage that may occur between the lower semiconductor chip 200 and the upper semiconductor chip 300 in the first reflow process may be less than the amount of warpage that may occur between the package substrate 100 and the upper semiconductor chip 300 in the second reflow process. Accordingly, the second pitch P20 and the second width W2 of the second pillar patterns 421 may be set respectively smaller than the first pitch P10 and the first width W1 of the first pillar patterns 411 and still provide a satisfactory connection to the conductive pads 250 after the first reflow process and the second reflow process. Accordingly, the upper semiconductor chip 300 may be favorably attached to the substrate 100 and the lower semiconductor chip 200 while providing for a compact-sized semiconductor package.

As shown in FIG. 5D, because the preliminary lower solder parts 413PB are provided, the first solder parts 413 may be easily formed due to combinations between the preliminary upper solder parts 413PA and the preliminary lower solder parts 413PB.

After the second reflow process is completed, a top surface 200a of the lower semiconductor chip 200 may be located at a higher level than that of a top surface 100a of the package substrate 100. Because the heights H1 of the first pillar patterns 411 are substantially the same as the heights H2 of the second pillar patterns 421, the first pillar patterns 411 may have their bottom surfaces 411b located at substantially the same as that of bottom surfaces 421b of the second pillar patterns 421. An interval between the top surface 100a of the package substrate 100 and the bottom surfaces 411b of the first pillar patterns 411 may be greater than an interval between the top surface 200a of the lower semiconductor chip 200 and the bottom surfaces 421b of the second pillar patterns 421. Each of the first solder parts 413 may have a height H10 greater than a height H20 of each of the second solder parts 423. As discussed above, the amount of warpage that may occur between the lower semiconductor chip 200 and the upper semiconductor chip 300 in the first reflow process may be less than the amount of warpage that may occur between the package substrate 100 and the upper semiconductor chip 300 in the second reflow process. Accordingly, the second pitch P20 and the second width W2 of the second pillar patterns 421 may be respectively smaller than the first pitch P10 and the first width W1 of the first pillar patterns 411 and still provide a satisfactory connection to the conductive pads 250 after the first reflow process and the second reflow process. In addition, the height H20 (and as a result volume) of each of the second solder parts 423 may be smaller than the height H10 (and as a result volume) of each of the first solder parts 413. Accordingly, the upper semiconductor chip 300 may be favorably attached to the substrate 100 and the lower semiconductor chip 200 while providing for a compact-sized semiconductor package.

Referring back to FIG. 1B, a first under-fill layer 610 may be formed between the upper semiconductor chip 300 and the package substrate 100 and between the lower semiconductor chip 200 and the recessed portion 190. After that, a molding layer 600 may be formed on the top surface 100a of the package substrate 100 to thereby cover sidewalls of the upper semiconductor chip 300. Alternatively, the molding layer 600 may further cover the top surface of the upper semiconductor chip 300. The examples mentioned above may fabricate a semiconductor package of FIGS. 1A to 1C.

Figure 6A:
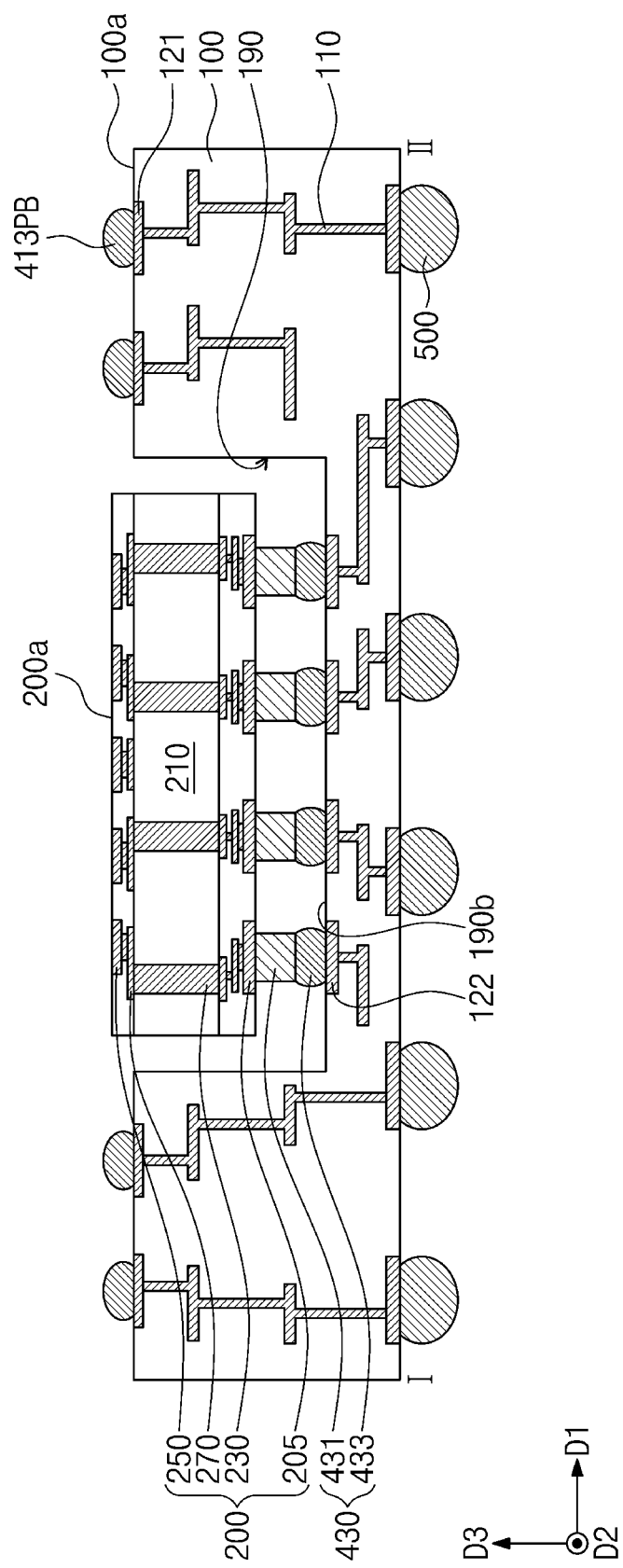
FIGS. 6A to 6C illustrate cross-sectional views showing a method of fabricating a semiconductor package according to some example embodiments.
Figure 6B:
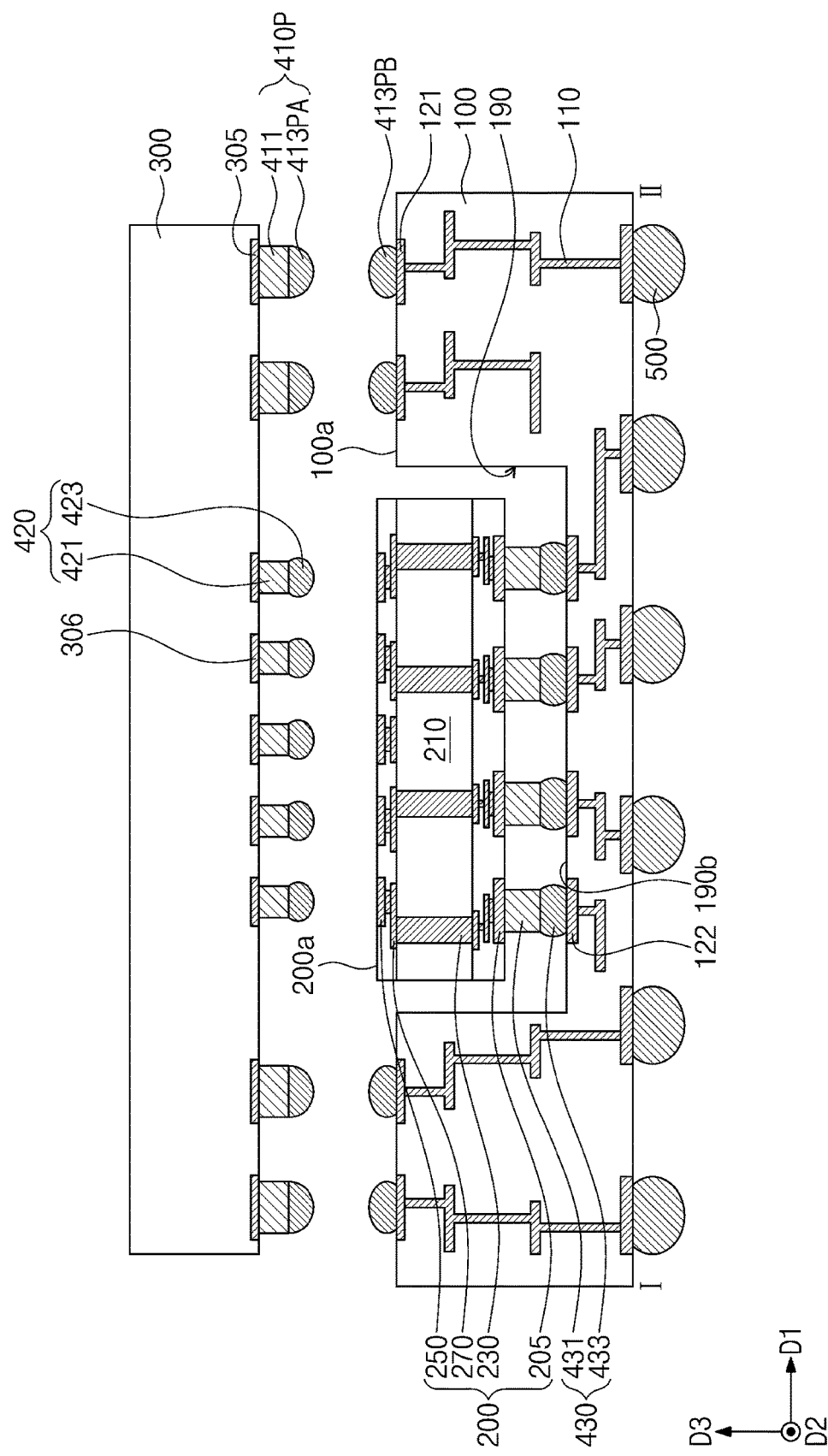
Figure 6C:
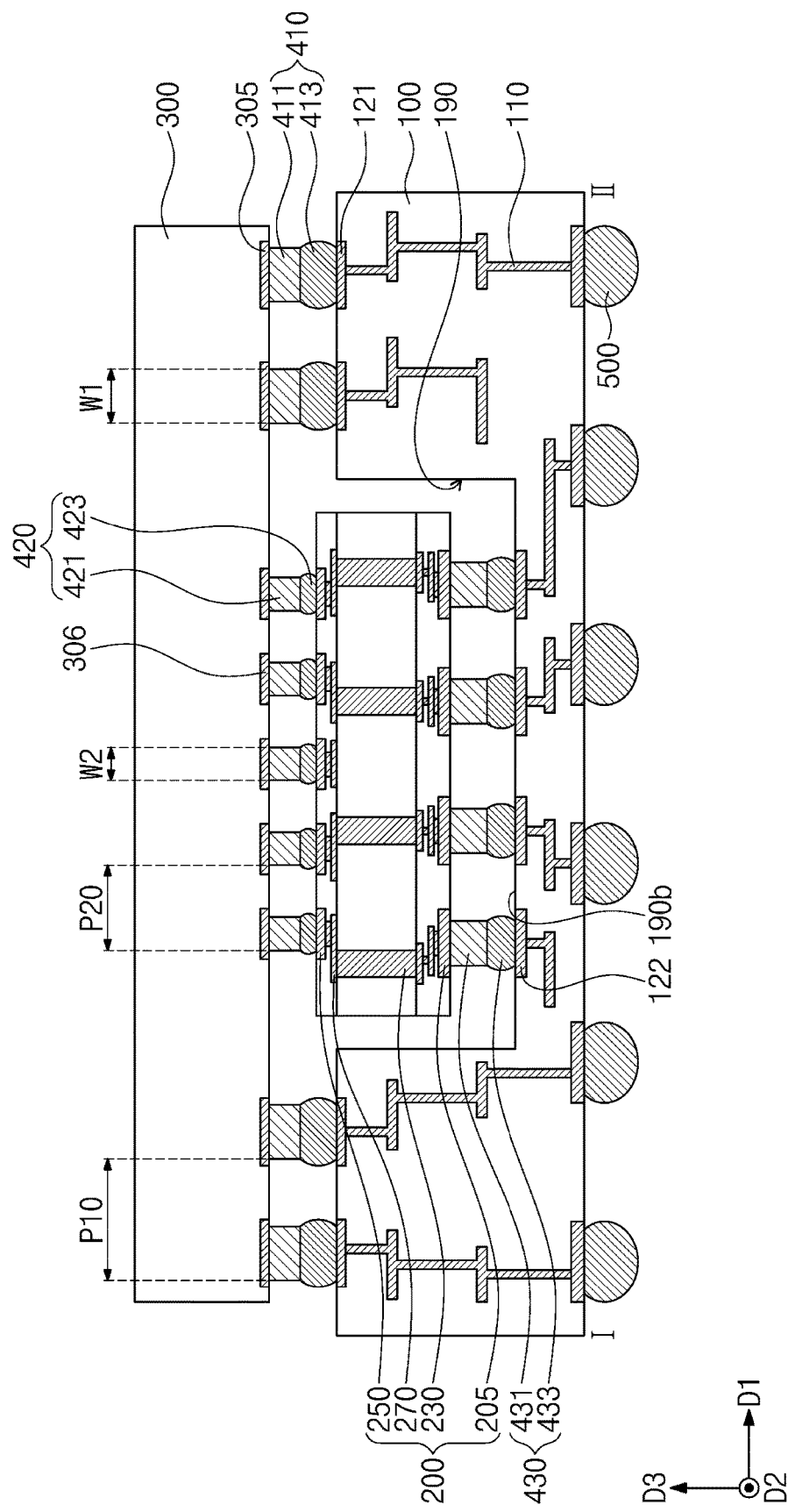

FIGS. 6A to 6C illustrate cross-sectional views which correspond to that taken along line I-II of FIG. 1A, showing a method of fabricating a semiconductor package according to some example embodiments.

Referring to FIG. 6A, a package substrate 100 may be prepared which has a recessed portion 190. The package substrate 100 may include first substrate pads 121 and second substrate pads 122. Preliminary lower solder parts 413PB may be correspondingly formed on the first substrate pads 121.

Lower bumps 430 may be formed on a bottom surface of a lower semiconductor chip 200. The lower semiconductor chip 200 may be disposed in the recessed portion 190 of the package substrate 100. In this step, lower solder parts 433 of the lower bumps 430 may be correspondingly aligned with the second substrate pads 122.

A third reflow process may be performed in which the lower solder parts 433 are correspondingly connected to the second substrate pads 122. Therefore, the lower semiconductor chip 200 may be electrically connected through the lower bumps 430 to the package substrate 100. The third reflow process may be executed after or before the formation of the preliminary lower solder parts 413PB. After the third reflow process is completed, the lower semiconductor chip 200 may have a top surface 200a located at a higher level than that of a top surface 100a of the package substrate 100.

Referring to FIG. 6B, an upper semiconductor chip 300, first preliminary bumps 410P, and second bumps 420 may be prepared. In this step, the first preliminary bumps 410P may be coupled to corresponding first upper chip pads 305, and the second bumps 420 may be coupled to corresponding second upper chip pads 306.

The upper semiconductor chip 300 may be disposed on the top surface 200a of the lower semiconductor chip 200 and the top surface 100a of the package substrate 100. In this case, preliminary upper solder parts 413PA of the first preliminary bumps 410P may be aligned with corresponding preliminary lower solder parts 413PB, and second solder parts 423 of the second bumps 420 may be aligned with corresponding conductive pads 250.

Referring sequentially to FIGS. 6B and 6C, the upper semiconductor chip 300 may descend to cause the preliminary upper solder parts 413PA to contact corresponding preliminary lower solder parts 413PB and also to cause the second solder parts 423 of the second bumps 420 to contact corresponding conductive pads 250.

Afterwards, a fourth reflow process may be performed. The fourth reflow process may be executed at a temperate equal to or higher than melting points of the preliminary upper solder parts 413PA, the preliminary lower solder parts 413PB, and the second solder parts 423. The fourth reflow process may allow the second solder parts 423 to have connection with corresponding conductive pads 250. Therefore, the upper semiconductor chip 300 may be electrically connected through the second bumps 420 to the lower semiconductor chip 200.

The fourth reflow process may correspondingly connect the preliminary upper solder parts 413PA to the preliminary lower solder parts 413PB, and first solder parts 413 may thus be formed. Accordingly, first bumps 410 may be formed. The first bumps 410 may include first solder parts 413 and first pillar patterns 411. The first pillar patterns 411 have a first pitch P10 and a first width W1 each of which is relatively large, and therefore even when warpage occurs on the package substrate 100 or the upper semiconductor chip 300 in the fourth reflow process, the first solder parts 413 may be satisfactorily connected to the first substrate pads 121 and the first pillar patterns 411.

Referring back to FIG. 1B, a second under-fill layer 620 may be formed between the lower semiconductor chip 200 and the upper semiconductor chip 300, thereby encapsulating the second bumps 420. A first under-fill layer 610 may be formed between the upper semiconductor chip 300 and the package substrate 100 and between the lower semiconductor chip 200 and the recessed portion 190. A molding layer 600 may be formed on the top surface 100a of the package substrate 100, thereby covering sidewalls of the upper semiconductor chip 300. Alternatively, the molding layer 600 may further cover the top surface of the upper semiconductor chip 300. The examples mentioned above may fabricate a semiconductor package of FIGS. 1A to 1C.

According to the examples of the present inventive concepts, a lower semiconductor chip may be provided in a recessed portion, and accordingly a semiconductor package may be small in size. First bumps may be interposed between an upper semiconductor chip and a top surface of the package substrate. The upper semiconductor chip may be easily connected through the first bumps to the package substrate. Accordingly, the fabrication processes of the semiconductor package may also be simplified.

This detailed description of the examples of the present inventive concepts should not be construed as limited to the embodiments set forth herein, and it is intended that the examples of the present inventive concepts cover the various combinations, the modifications and variations of this invention without departing from the spirit and scope of the present inventive concepts. The appended claims should be construed to include other embodiments.

What is claimed is:

1. A semiconductor package, comprising:
   a package substrate that extends in a first direction and a second direction perpendicular to the first direction and that includes a recessed portion on a top surface of the package substrate;
   a lower semiconductor chip in the recessed portion of the package substrate;
   an upper semiconductor chip on the lower semiconductor chip and the package substrate, the upper semiconductor chip having a width greater than a width of the lower semiconductor chip, in the first direction;
   a plurality of first bumps directly between the package substrate and the upper semiconductor chip; and
   a plurality of second bumps directly between the lower semiconductor chip and the upper semiconductor chip,
   wherein a pitch of the second bumps is less than a pitch of the first bumps, in the first direction,
   wherein each of the first bumps includes:
      first solder part on the package substrate; and
      a first pillar pattern between the first solder part and the upper semiconductor chip,
   wherein each of the second bumps includes:
      a second solder part on the lower semiconductor chip; and
      a second pillar pattern between the second solder part and the upper semiconductor chip, and
   wherein, in a third direction perpendicular to the first direction and the second direction, a height of the second solder part is less than a height of the first solder part.

2. The semiconductor package of claim 1, wherein, in the first direction, a width of the second bumps is less than a width of the first bumps.

3. The semiconductor package of claim 2, wherein, in the first direction,
   the pitch of the first bumps is in a range from about 90 μm to about 200 μm,
   the pitch of the second bumps is in a range from about 10 μm to about 150 μm, the width of the first bump is in a range from about 30 µm to about 120 µm, and the width of the second bump is in a range from about 7 µm to about 70 µm.

4. The semiconductor package of claim 1, wherein, in the third direction, a height of each of the second bumps is less than a height of each of the first bumps.

5. The semiconductor package of claim 1, further comprising a lower bump between the lower semiconductor chip and a bottom surface of the recessed portion of the package substrate, and wherein the lower bump is not aligned with the second bumps in the third direction.

6. The semiconductor package of claim 5, wherein the lower bump is one of a plurality of lower bumps, wherein, in the first direction, a pitch of the lower bumps is the same as or greater than the pitch of the second bumps, and wherein, in the first direction, a width of the lower bumps is the same as or greater than a width of the second bumps.

7. The semiconductor package of claim 1, wherein a bottom surface of the second pillar pattern is at the same level in the third direction as a level of a bottom surface of the first pillar pattern.

8. The semiconductor package of claim 1, wherein, in the third direction, a depth of the recessed portion is in a range from about 50 µm to about 300 µm.

9. The semiconductor package of claim 1, further comprising an under-fill layer in a first gap between the package substrate and the upper semiconductor chip and in a second gap between the recessed portion and the lower semiconductor chip.

10. A semiconductor package, comprising:
a package substrate that extends in a first direction and a second direction perpendicular to the first direction and that includes a recessed portion on a top surface of the package substrate;
a lower semiconductor chip in the recessed portion of the package substrate;
an upper semiconductor chip on the lower semiconductor chip and the package substrate;
a plurality of first bumps directly between the package substrate and the upper semiconductor chip, the first bumps including first solder parts and first pillar patterns; and
a plurality of second bumps directly between the lower semiconductor chip and the upper semiconductor chip, each of the second bumps including second solder parts and second pillar patterns,
wherein a height of the second pillar patterns is the same as a height of the first pillar patterns in a third direction perpendicular to the first direction and the second direction, and
wherein a height of the second solder parts is less than a height of the first solder parts in the third direction.

11. The semiconductor package of claim 10, wherein, in the first direction,
a pitch of the second pillar patterns is less than a pitch of the first pillar patterns, and
a width of the second pillar patterns is the same as a width of the first pillar patterns.

12. The semiconductor package of claim 10, further comprising a plurality of lower bumps between the lower semiconductor chip and a bottom surface of the recessed portion of the package substrate, and wherein a sum of the number of the first bumps and the number of the second bumps is greater than the number of the lower bumps.

13. The semiconductor package of claim 12, wherein the lower bumps include lower solder parts and lower pillar patterns, wherein, in the first direction, a pitch of the lower pillar patterns is the same as or greater than a pitch of the second pillar patterns.

14. The semiconductor package of claim 10, wherein
a width of the upper semiconductor chip is greater than a width of the lower semiconductor chip in the first direction, and
a length of the upper semiconductor chip is greater than a length of the lower semiconductor chip in the second direction.

15. The semiconductor package of claim 10, wherein the lower semiconductor chip includes:
a plurality of through structures in the lower semiconductor chip;
a plurality of redistribution patterns on a top surface of the lower semiconductor chip and correspondingly coupled to the through structures; and
a plurality of conductive pads on and correspondingly coupled to the redistribution patterns,
wherein the second solder parts are correspondingly coupled to the conductive pads.

16. The semiconductor package of claim 15, wherein the package substrate further includes a plurality of substrate pads on the top surface of the package substrate, and
wherein the first solder parts are correspondingly coupled to the substrate pads.

17. The semiconductor package of claim 10, wherein the top surface of the package substrate is at a level lower than a level of a top surface of the lower semiconductor chip in the third direction.

18. A semiconductor package, comprising:
a package substrate that extends in a first direction and a second direction perpendicular to the first direction and that includes a recessed portion on a top surface of the package substrate;
a solder terminal on a bottom surface of the package substrate;
a lower semiconductor chip in the recessed portion of the package substrate, the lower semiconductor chip including a plurality of through structures in the lower semiconductor chip;
an upper semiconductor chip on the lower semiconductor chip and the package substrate, the upper semiconductor chip having a width greater than a width of the lower semiconductor chip, in the first direction;
a plurality of first bumps directly between the package substrate and the upper semiconductor chip;
a plurality of second bumps directly between the lower semiconductor chip and the upper semiconductor chip;
a plurality of lower bumps between the lower semiconductor chip and a bottom surface of the recessed portion in the package substrate; and
an under-fill layer in a first gap between the package substrate and the lower semiconductor chip and in a second gap between the package substrate and the upper semiconductor chip, the under-fill layer covering the lower bumps and the first bumps,
wherein the first bumps include first solder parts and first pillar patterns,
wherein the second bumps include second solder parts and second pillar patterns, wherein a pitch of the second pillar patterns is less than a pitch of the first pillar patterns in the first direction, wherein a width of the second pillar patterns is less than a width of the first pillar patterns in the first direction, wherein the upper semiconductor chip includes a plurality of first upper chip pads and a plurality of second upper chip pads, wherein the first pillar patterns are correspondingly on bottom surfaces of the first upper chip pads, wherein the first solder parts are correspondingly between the package substrate and the first pillar patterns, wherein the second pillar patterns are correspondingly on bottom surfaces of the second upper chip pads, wherein the second solder parts are correspondingly between the lower semiconductor chip and the second pillar patterns, wherein a height of the second pillar patterns is the same as a height of the first pillar patterns in a third direction perpendicular to the first and second direction, and wherein a height of the second solder parts is less than a height of the first solder parts in the third direction.

* * * * *